United States Patent
Goth et al.

(10) Patent No.: US 6,167,621 B1
(45) Date of Patent: Jan. 2, 2001

(54) CENTER FEED PARALLEL FLOW COLD PLATE DUAL REFRIGERATION SYSTEMS

(75) Inventors: Gary F. Goth, Pleasant Valley; John J. Loparco, Poughkeepsie, both of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/434,897

(22) Filed: Nov. 5, 1999

Related U.S. Application Data

(62) Division of application No. 09/182,960, filed on Oct. 30, 1998, now Pat. No. 6,053,238.

(51) Int. Cl.[7] ............................................. B21D 53/02
(52) U.S. Cl. ........................ 29/890.054; 29/890.03; 29/890.049; 165/10; 165/80.4
(58) Field of Search ................ 29/890.03, 890.049, 29/890.054; 165/140, 10, 168, 80.4; 361/699, 711; 257/714

(56) References Cited

U.S. PATENT DOCUMENTS

| | | | |
|---|---|---|---|
| 2,612,357 | 9/1952 | Parks | 165/140 X |
| 3,625,498 | 12/1971 | Adamec et al. | 165/168 |
| 4,475,152 | 10/1984 | Ikegame et al. | 363/141 |
| 4,671,347 | 6/1987 | MacCracken | 165/10 |
| 5,127,465 | 7/1992 | Fischer | 165/140 X |
| 5,232,047 | 8/1993 | Matthews | 165/168 |
| 5,484,015 | 1/1996 | Kyees | 165/168 |
| 5,829,516 | 11/1998 | Lavochkin | 165/804 |
| 6,056,043 | * 5/2000 | Strahle et al. | 165/10 |

* cited by examiner

*Primary Examiner*—Allen Flanigan
(74) *Attorney, Agent, or Firm*—Floyd A. Gonzalez; Cantor Colburn LLP

(57) ABSTRACT

A cold plate includes two flow-wise isolated coolant (or refrigerant) passages (or sets of passages) originating at the center of the cold plate and terminating at an edge for use in conjunction with separate refrigeration systems. The cold plate passages are centrally fed by the refrigeration system to create a cooling gradient radiating from the center of the cold plate to its edges. The center-fed cold plate provides a more even temperature gradient across the thermal source. The cold plate passages do not permit flow communication between distinct coolant (or refrigerant) paths. This permits two distinct cooling systems to operate either dually or in a redundant manner. Nonetheless, flow isolation is achieved while still maintaining tight thermal coupling between each path and the object, such as an electronic computer processor module, to be cooled.

9 Claims, 19 Drawing Sheets

CENTER FEED PARALLEL FLOW COLD PLATE DUAL REFRIGERATION SYSTEMS

This is a div. of Ser. No. 09/182,960 filed Oct. 30, 1998, now U.S. Pat. No. 6,053,238.

BACKGROUND OF THE INVENTION

1. Field of the Invention

The present invention is generally directed to providing reliable cooling systems for mainframe computer systems or for any electronic system requiring cooling. More particularly, the present invention is directed to a redundant refrigeration system employing a single cold plate which preserves flow isolation between the fluids in the redundant systems. In another aspect of the present invention, there is provided a combination of air and redundant refrigeration cooling for an electronic device such as a mainframe or server processing unit disposed within a cabinet possibly along with other less thermally critical components. In yet another aspect of the present invention, there is provided a modular refrigeration unit capable of operating continuously in a variety of ambient conditions and under a variety of thermal loads.

2. Prior Art

In recent years, the semiconductor industry has taken advantage of the fact that CMOS circuits dissipate less power than bipolar circuits. This has permitted more dense packaging and correspondingly faster CMOS circuits. However, almost no matter how fast one wishes to run a given electronic CMOS circuit chip, there is always the possibility of running it faster if the chip is cooled and thermal energy is removed from it during its operation. This is particularly true of computer processor circuit chips and even more particularly true of these chips when disposed within multi-chip modules which generate significant amounts of heat. Because there is a great demand to run these processor modules at higher speeds, the corresponding clock frequencies at which these devices must operate become higher. In this regard, it should be noted that it is known that power generation rises in proportion to the clock frequency. Accordingly, it is seen that the desire for faster computers generates not only demand for computer systems but also generates thermal demands in terms of energy which must be removed for faster, safer and more reliable circuit operation. In this regard, it is to be particularly noted that, in the long run, thermal energy is the single biggest impediment to semiconductor operation integrity.

In addition to the demand for higher and higher processor speeds, there is also a concomitant demand for reliable computer systems. This means that users are increasingly unwilling to accept down time as a fact of life. This is particularly true in the mainframe and server realms. Reliability in air-cooled systems is relatively easily provided by employing multiple air- moving devices (fans, blowers, etc.). Other arrangements which incorporate a degree of redundancy employ multiple air-moving devices whose speeds can be ramped up in terms of their air delivery capacity if it is detected that there is a failure or need within the system to do so. However, desired chip-operating power levels are nonetheless now approaching the point where air cooling is not the ideal solution for all parts of the system in all circumstances. While it is possible to operate fans and blowers at higher speeds, this is not always desirable for acoustic reasons. Accordingly, the use of direct cooling through the utilization of a refrigerant and a refrigeration system becomes more desirable, especially if faster chip speeds are the goal.

However, it is difficult to build redundancy into systems employing refrigerants. Such redundant systems naturally require the utilization of at least two separate refrigeration systems. This means that at least two motor-driven compressors are required. However, it is well recognized that the compressor, representing a major moving part apparatus, is also one which is prone to mechanical failure. The desire for zero down time and minimum maintenance requirements also make the utilization of multiple compressors difficult. These compressors should be designed, controlled and set up so that various failure modalities do not bring the entire computer system down nor risk damage to the components within the system. Furthermore, one should also be concerned about refrigerant leaks. Accordingly, the refrigerant systems for redundant cooling must be designed so that the refrigerant loops are not in flow communication with one another so that a leak in one loop would bring down the whole system. However, there are great practical difficulties in doing this since it requires two separate loops which are maintained in flow-wise isolation from one another and yet, at the same time, requires the utilization of refrigerant loops which are in very close thermal proximity with one another at the point within a cold plate which is attached (or otherwise thermally coupled) to the electronic circuit module or system to be cooled.

While certain electronic components or modules produce relatively large amounts of thermal energy, it is often the case that these modules are employed in conjunction with other electronic circuit components which also require some degree of cooling but do not operate at temperatures so high as to require direct cooling via a cold plate and/or refrigerant system. If modules of varying thermal energy output are employed in the same system, it is therefore desirable that the cooling systems employed for the lower thermal output modules be cooled in a manner which is compatible with cooling systems employed for the higher temperature modules. To the extent that a degree of cooperation between these systems can be provided, the net result is a system which is even more reliable and dependable. Nonetheless, these dual cooling modalities must be accommodated within a single cabinet or frame.

Another very desirable feature of any system which is employed to cool electronic devices and systems, particularly computer systems, is that a separate chilled water source not be necessary. While in some situations where the requirements are such that the inconvenience of chilled water plumbing is offset by the needs and/or desires for extremely rapid computation and computer throughput, nonetheless, less stringent requirements for computational speed are nonetheless preferably addressed through the utilization of machines which are air cooled. This cooling methodology is desirable in that it permits the utilization of stand-alone units. These self-contained units are, everything else being equal, a generally preferred solution to providing data processing server solutions.

There are yet other requirements that must be met when designing cooling units for computer systems, especially those which operate continuously and which may in fact be present in a variety of different thermal environments. Since computer systems run continuously, so must their cooling systems unlike a normal household or similar refrigerator which is operated under a so-called bang-bang control philosophy in which the unit is alternating either totally on or totally off. Furthermore, since large computer systems experience, over the course of time, say hours, variations in user load and demand, the amount of heat which must be removed also varies over time. Therefore, a cooling unit or cooling module for a computer system must be able not only to operate continuously but also be able to adjust its cooling capability in response to varying thermal loads. And furthermore, since it is intended that these modular cooling units be used in groups of two or more to assure redundancy and since not all of these units are always intended to be operating at the same time, there will be times when the thermal load is very small. Therefore, problems associated with low speed motor/compressor operation must be addressed along with problems associated with starting and/or stopping the cooling unit when, for example, normal scheduled switching between modular refrigeration units occurs.

SUMMARY OF THE INVENTION

In accordance with a preferred embodiment of the present invention, an apparatus for cooling electronic circuits comprises a novel cold plate with dual coolant flow passages. These passages are isolated from one another in the sense that they are not in flow communication and yet, nonetheless, these coolant flow passages are still in intimate thermal contact with one another within the cold plate. The inlet for each coolant loop is at the center of the cold plate while the outlet for each coolant loop is at the edge of the cold plate. Each loop also branches at the cold plate to provide parallel (circuit-wise) flow towards each of the side edges. Thus, because the coolant is provided first to the center of the plate where the heat flux is greatest, a smoother, more uniform thermal gradient is achieved across the cold plate and electronic device to be cooled. In conjunction with this cold plate, first and second refrigeration systems are employed to provide a desired degree of redundancy. Each of these refrigeration systems includes a compressor, condenser and expansion device connected in a closed refrigerant loop with one of the passages in the dual-passage cold plate. In preferred embodiments of the present invention, there is also provided a control mechanism for operating the first and second refrigeration systems in a time-alternating fashion. Additionally, in preferred embodiments, there is also provided a mechanism for reducing the power produced by the electronic system which is being cooled in the event of a failure in one of the refrigeration loops.

In another embodiment of the present invention, a redundantly cooled electronic system comprises a cabinet which has an air intake and an air exhaust. A planar circuit board, together with an electronic module disposed on the planar circuit board, is contained within the cabinet. An air-moving mechanism is provided for moving air from the inlet opening to the exhaust opening past the electronic module. The electronic module (processor) has a cold plate which is in thermal contact with it. The cold plate is as described above and possesses first and second coolant passages which are in turn connected to redundant first and second refrigeration systems. It is noted that in the description contained herein, the reference to a redundant cooling system is primarily directed to the notion that two separate and isolated refrigeration systems are supplied.

In yet another embodiment of the present invention, a modular refrigeration unit (MRU) is provided for supplying cooled refrigerant to one side of a dual-loop evaporator/cold plate. The MRU is enabled for continuous operation under various loads and in various thermal environments through the inclusion of a direct current (dc) motor together with the further inclusion of a hot gas bypass value (HGBV) which bypasses the condenser and thermal expansion valve when the motor/compressor unit is operating under low thermal load conditions or upon startup. The unit is packaged in a single module which is easily coupled into an already running computer processing system via two quick disconnect refrigerant lines, a power cable and a signal cable.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION OF THE INVENTION

Figures 1A, 1B:
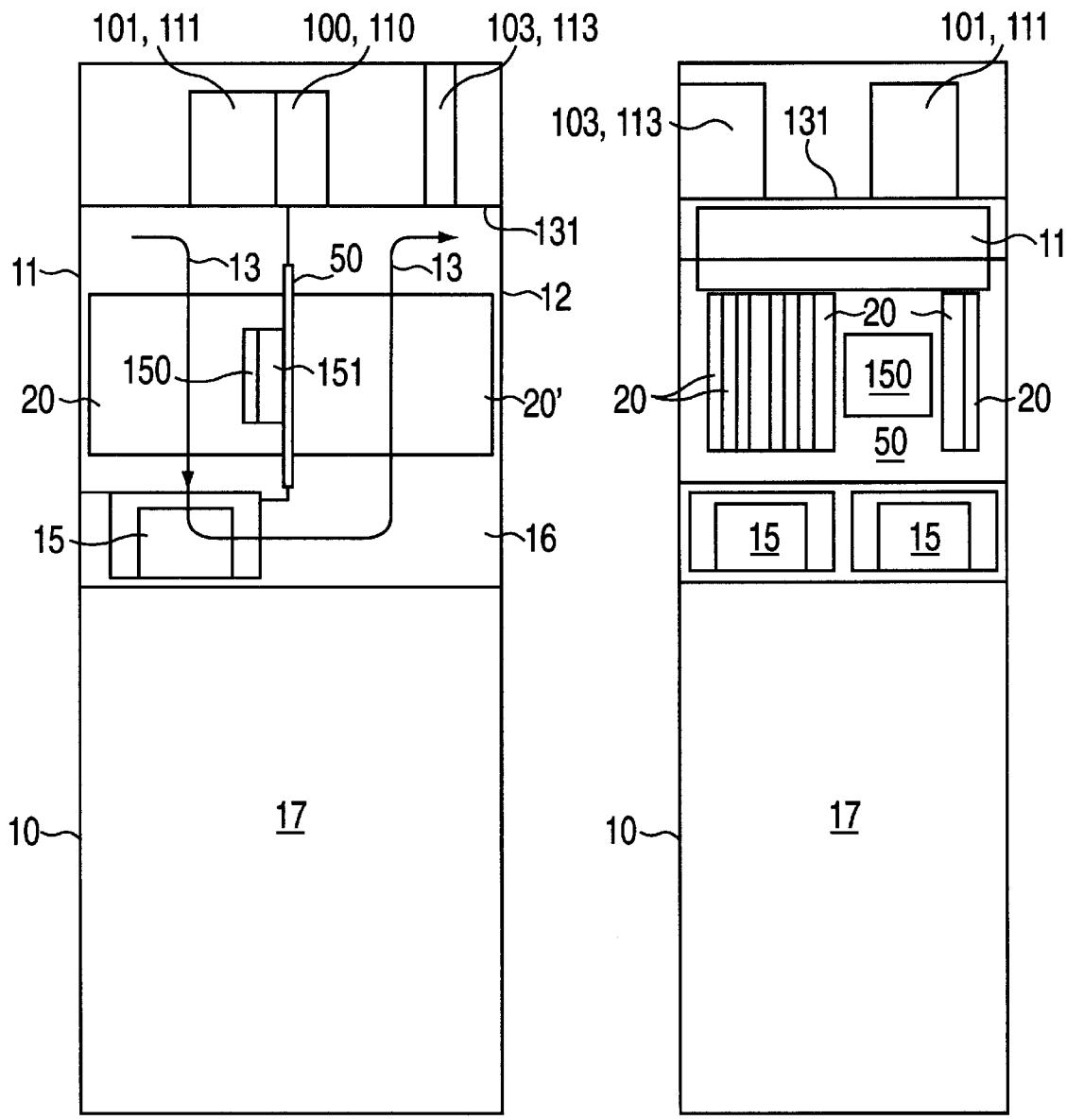
FIG. 1A is a side elevation view illustrating the arrangement of components in a preferred embodiment of the present invention.
FIG. 1B is a view similar to FIG. 1A but more particularly illustrating a front view.

FIG. 1A illustrates a side view of one embodiment of the present invention. This invention employs cabinet 10 having inlet opening 11 and outlet opening 12 for the passage of air there through. The flow of air is induced by means of one or more blowers 15. Fans or other air-moving devices could also be employed for this same purpose. However, blowers are preferred because of their efficiency. In the apparatus shown in FIG. 1A, air moves from inlet 11 in cabinet 10 to exhaust 12 along air flow line 13. The flow of air is employed for the particular purpose of cooling certain of the electronic components disposed on printed circuit cards or so-called "books" 20. Air flows down between these books or cards through blower(s) 15 to plenum 16 and thence through cards 20' on the other side of mother board 50 into which books 20 are inserted. Thus, having flowed passed cards 20 and 20', air stream 13 exits through exhaust 12 in cabinet 10.

The description provided thus far is therefore seen to disclose a preferred method for cooling certain ones of the electronic components, namely, those components located on cards 20 and 20' which are of sufficiently low power that air cooling is an appropriate modality. However, an important feature of the present invention is directed to the specific means and systems employed for cooling electronic module 151. In preferred embodiments of the present invention, module 151 includes circuits for data processor components associated with a mainframe or server computer system. In particular, the system shown in FIGS. 1A and 1B illustrates the placement of cold plate 150 which forms a significant aspect of one embodiment of the present invention. Cold plate 150 is connected by means of flexible refrigerant lines (not shown for clarity) to a refrigeration system present in the upper portion of cabinet 10 above shelf 131. The refrigeration system for cooling cold plate 150 and, thus, module 151 includes items such as motors, compressors and condensers together with an expansion device. Thus, the system shown in FIGS. 1A and 1B represents an apparatus in which both air cooling and direct refrigerant cooling is employed. It is particularly useful for a proper understanding to note that electronic chip module 151 is not mounted in a sideways fashion as are cards 20 primarily because of the fact that module 151 typically possesses a very large number of pins for achieving connection and communication with other circuits in the computer and/or with other computer systems. Thus, the I/O (input/output) pin requirements for module 151 dictate that it preferably be mounted in the fashion shown. In FIG. 1B, this electronic module is shown disposed beneath cold plate 150 which is visible in FIG. 1B.

As shown in the figures, area 17 may include the same components as shown in the top half of the cabinet. Additionally, area 17 may also include power supply components (a power cage, e.g.) along with its own air-moving device. However, the components disposed in area 17 are not otherwise relevant to the present invention.

Figure 2:
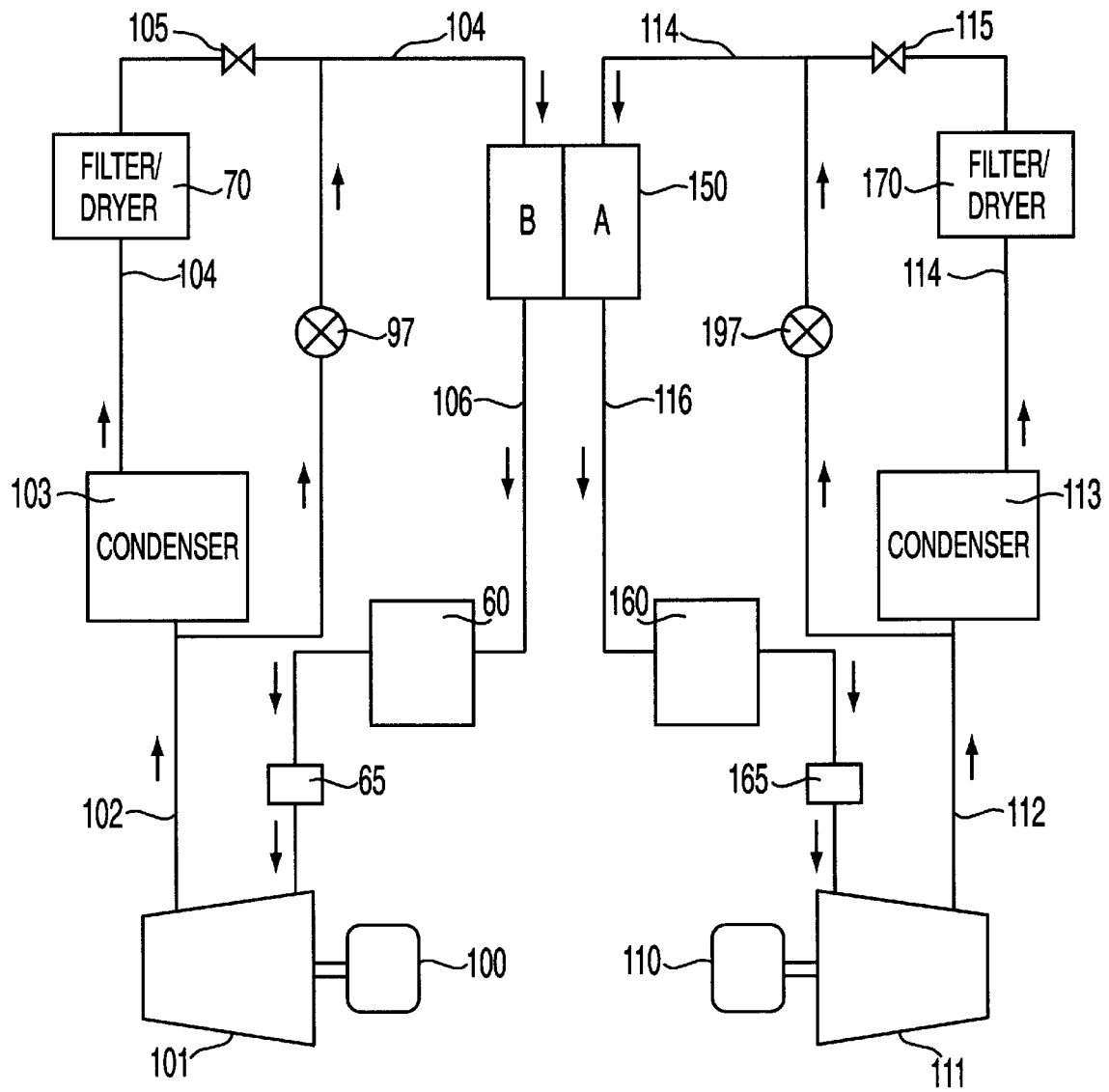
FIG. 2 is a block diagram illustrating a dual redundant refrigeration system for utilization with a cold plate in accordance with the present invention.

In order to provide the desired degree of system cooling redundancy, a dual refrigeration system, such as that shown in FIG. 2, is provided in accordance with preferred embodiments of the present invention. The heart of this dual refrigeration system is the inclusion of cold plate 150 which has contained therein isolated coolant passages for a first refrigerant loop (circuit A) and a second refrigerant loop (circuit B). The cold plate itself may be constructed in several different ways. The cold plate and its construction is more particularly described below with reference to FIGS. 8, 9A, 9B, 10, 11, 12, 13 and 17. The primary feature of cold plate 150 is that the coolant passages contained therein are isolated from one another in a flow-wise fashion. That is, cold plate 150 is designed so as to prevent leakage or seepage from one refrigerant loop (circuit A) to the other refrigerant loop (circuit B). Nonetheless, in spite the flow-wise isolation, the two coolant loops provided are, nonetheless, in intimate thermal contact with one another and with the body of the cold plate so as to remove heat from module 151 in an efficient manner.

Thus, in accordance with the redundancy requirements of the present invention, FIG. 2 illustrates a refrigerant system for circuit A and a refrigerant system for circuit B. In particular, motor 100 drives compressor 101 which is connected to condenser 103 by means of supply line 102. Likewise, condenser 103 is connected to circuit B for cold plate 150 by means of supply line 104 which passes through filter/dryer 70 which functions to trap particulate matter present in the refrigerant stream and also to remove water which might have become entrained in the refrigerant flow. Subsequent to filter/dryer 70, refrigerant flow passes through expansion device 105. Expansion device 105 is preferably an expansion valve. However, it may also comprise a capillary tube or thermostatic valve. Thus, expanded and cooled refrigerant is supplied to circuit B in cold plate 150. Subsequent to its picking up heat from module 151 through the body of cold plate 150, the refrigerant is returned via return line 106 to accumulator 60 which operates to prevent liquid from entering compressor 101. Accumulator 60 is also aided in its function by the inclusion of smaller capacity accumulator 65 which is included in preferred embodiments of the present invention to provide an extra degree of protection against the entry of liquid phase refrigerant into compressor 101. Subsequent to accumulator 65, vapor phase refrigerant is returned to compressor 101 where the cycle repeats. In addition, circuit A is provided with hot gas bypass value (HGBV) 97 which, as its name suggests, operates to pass hot refrigerant gasses from compressor 101 directly to cold plate 150. HGBV 97 is controllable in response to the temperature of cold plate 150 which is provided by module temperature sensor 185 which is preferably a thermistor device affixed to cold plate 150 at any convenient location. In preferred embodiments, HGBV 97 (and other HGBVs discussed herein) are electronically controlled. The HGBVs preferably employed herein are continuously throttleable but are currently operated in fully open and fully closed modes for convenience of design. The HGBVs operate to shunt hot gasses directly to cold plate 150 when its temperature is already sufficiently low. In particular, under these low temperature conditions, motor 100 runs at a lower speed in response to the reduced thermal load. At these lower speeds and loads, there is the danger of motor 101 stalling. Upon detection of such a condition, HGBV 97 is opened in response to a signal supplied to it from microprocessor control 195 (see FIG. 3).

In an analogous fashion, refrigerant flows in the loop in circuit A which includes compressor 111, line 112, condenser 113, filter/dryer 170, expansion device 115, cold plate 150, return line 116 which connects to accumulator 160, which in turn connects (side A) to smaller accumulator 165 and thence back to compressor 111 which is driven by motor 110. As in circuit B, circuit A also includes HGBV 197, as shown.

The system shown in FIG. 2 lends itself to operation in several different modes. For example, it is possible to configure each of the two separate refrigeration systems so that each one is capable of removing all of the desired heat generated by electronic module 151. If such is the case, it is not necessary to run both refrigeration systems at the same time. Nonetheless, because of the desirability of maintaining seals in a wetted or moistened state, it is not desirable to shut off either one of the two refrigeration systems for extended periods of time. Thus, in the circumstance where either refrigeration system is capable of providing the desired cooling, it is desired to control these systems in a manner so that as one is being shut down, the other is being turned on and being brought up to speed so that the other system may "rest". In preferred methods of operation, the separate refrigeration systems are each run for about 24 hours, at which time the other system is brought online and the first system is shortly thereafter shut down.

Figure 3:
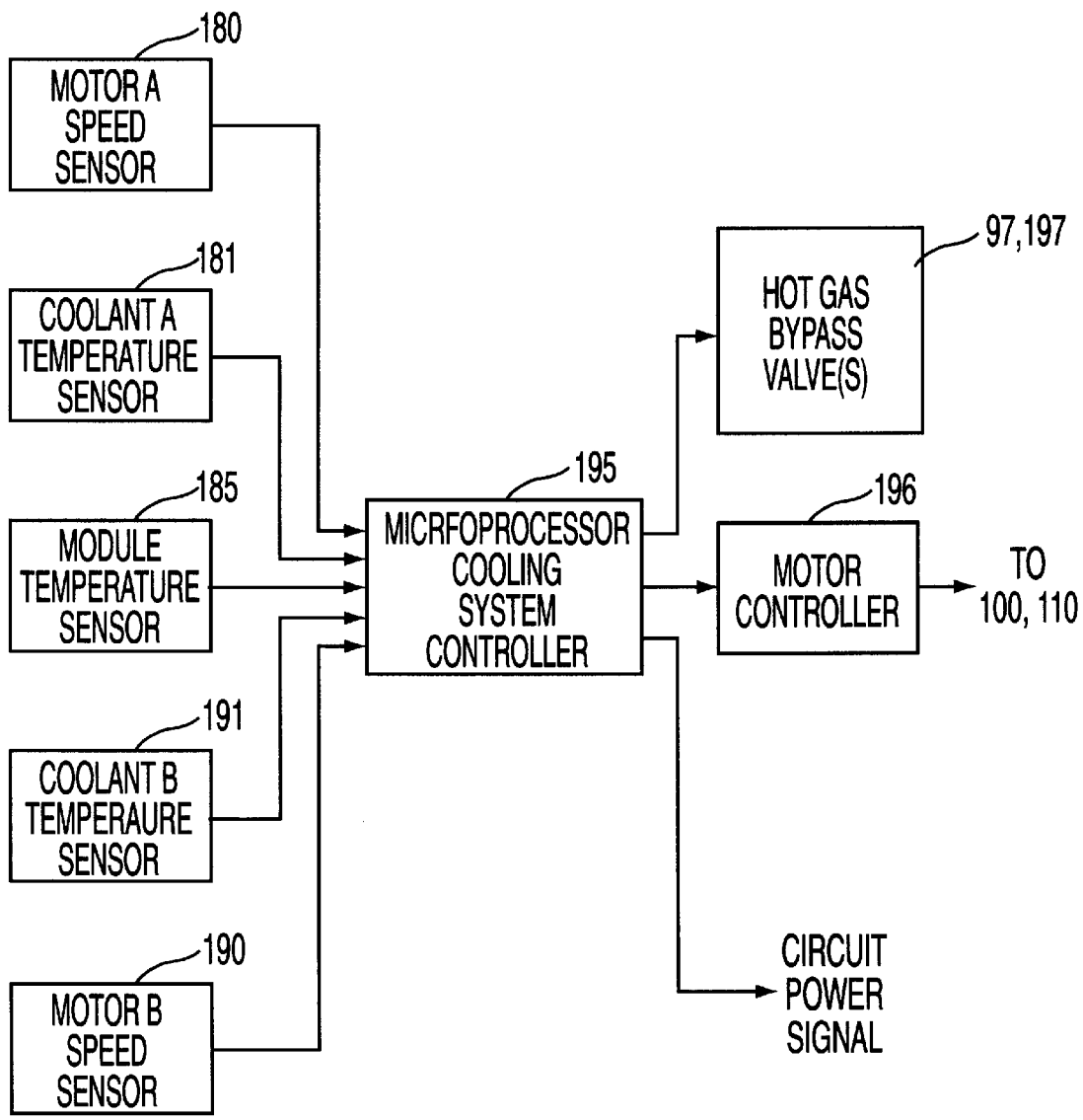
FIG. 3 is a block diagram illustrating the control system for operation of the redundant system shown in FIG. 2.

In those circumstances where the configuration of the refrigerant portions of the cooling system is such that both systems are required during normal operation, one must consider the possibility of the proper course of action to follow in the event that one of the refrigeration systems fails. Clearly, soft failure modalities are preferred. In order to effectuate such control, certain instrumentation readings are preferably provided to microprocessor cooling system controller 195, as shown in FIG. 3. Controller 195 has, as its principal design object, control of the temperature of module 151 and/or cold plate 150. In particular, desirable inputs for the cooling system controller include speed sensor 180 for motor A, speed sensor 190 for motor B, coolant temperature sensor 181 for circuit A, coolant temperature sensor 191 for circuit B and module temperature sensor 185 for module 151 and/or cold plate 150. Temperature sensors 181 and 191 are placed at the compressor exhaust and are used primarily for diagnostic purposes. Based upon these signal inputs, cooling system controller 195 provides signals to motor controller 196 to turn on either or both of motors 100 and 110 in FIG. 2. Additionally, cooling system controller 195 also preferably provides a "circuit power signal" which is provided as input to electronic processor module 151 as a signal that there is a cooling system problem and that the module should be operated at reduced power levels, say for example, by causing a reduction in the clock speed. In this manner, a solution to the cooling system problem including refrigerant or refrigeration system replacement may be effected while at the same time maintaining computer center operations although at a reduced pace and at a concomitantly reduced thermal load. Furthermore, in normal modes of operation, microprocessor controller 195 also controls HGBVs 97 and 197, as discussed above. Microprocessor controller 195 may comprise a processor unit dedicated to control purposes or, in fact, the functions of microprocessor 195 may be provided by programming code running within computer processor modules which are cooled by the refrigeration system herein and more particularly by programming running within microcoded portions of such a computer processor.

Figure 4:
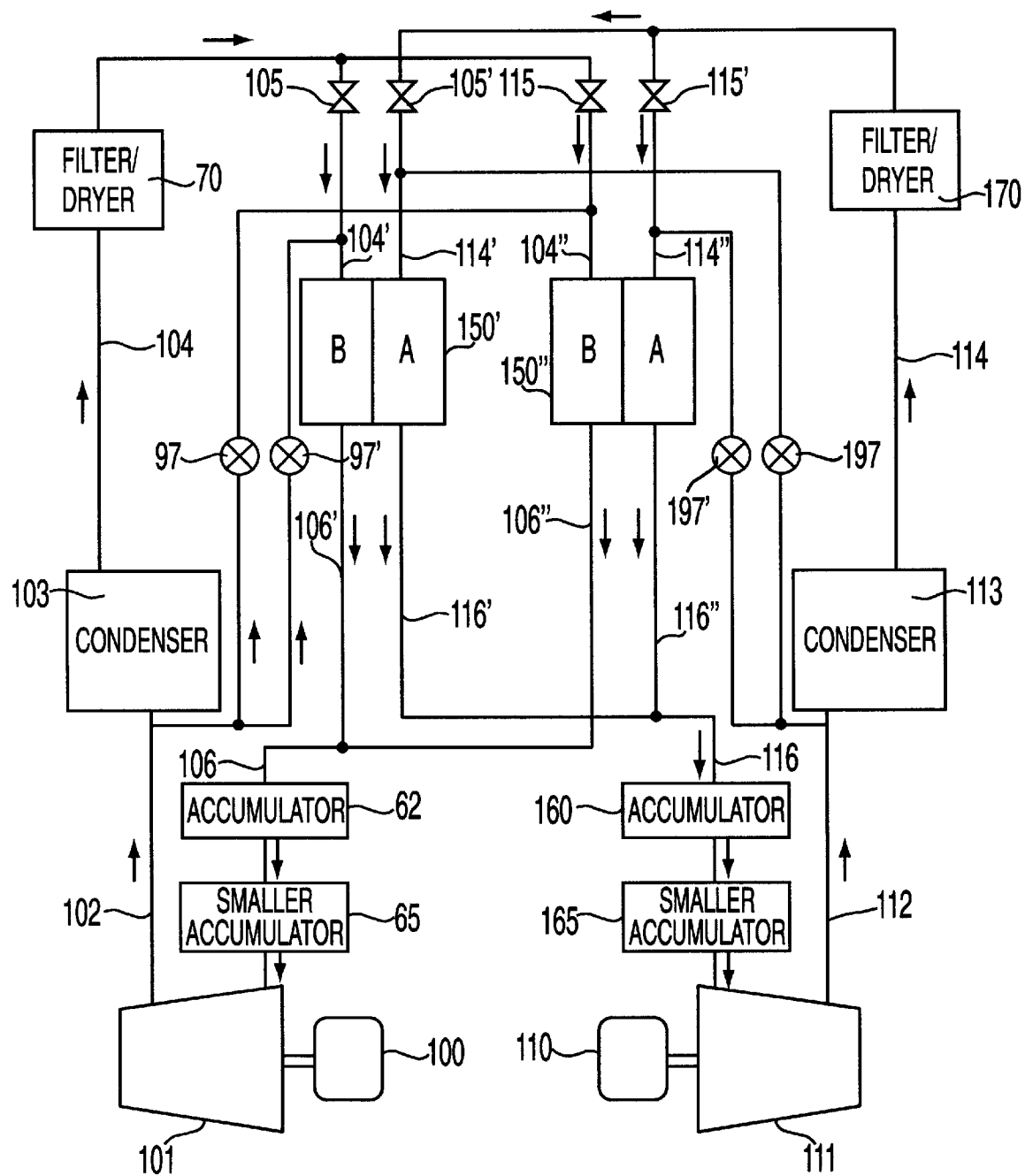
FIG. 4 is a functional block diagram illustrating an arrangement for a redundant cooling system for multiple electronic modules.

The redundant cooling system, shown in FIG. 2, is also employable in those situations where more than one electronic module is to be cooled. In these circumstances, each module is provided with its own cold plate and with its own expansion device. Accordingly, FIG. 4 illustrates the situation in which both cold plates 150' and 150" are to be cooled. In the situation shown in FIG. 4, each of the cold plates possesses dual passages which are thermally coupled but which are flow-wise isolated, that is, there is no flow communication between these passages.

Redundant cooling with flow isolation and refrigerant separation is maintained in the system shown in FIG. 4 by providing a supply line from condenser 103 to side B of cold plate 150' through line 104, filter/dryer 70, expansion device 105 and line 104'; similarly, supply line 104" supplies the circuit for side B of cold plate 150" from expansion device 115. Circuit B in both cases is completed by means of return lines 106' and 106" which return refrigerant from 150' and 150", respectively, either directly to compressor 101 or to common return line 106. (Accumulators 60 and 65, shown in FIG. 2, are also shown in FIG. 4.) Hot gas bypass valves 97 and 97' serve the same function as described above, only now HGBV 97 and HGBV 97' are controlled as a function of the temperature of cold plate 150' and HGBV 197' and HGBV 197 are controlled as a function of the temperature of cold plate 150". An analogous system is provided for circuit loop A in cold plate 150" through the supply and return lines shown which include compressor 111, condenser 113, filter/dryer 170, HGBVs 197 and 197" and accumulators (160 and 165), and expansion devices 105' and 115' in a refrigerant loop.

Figure 5:
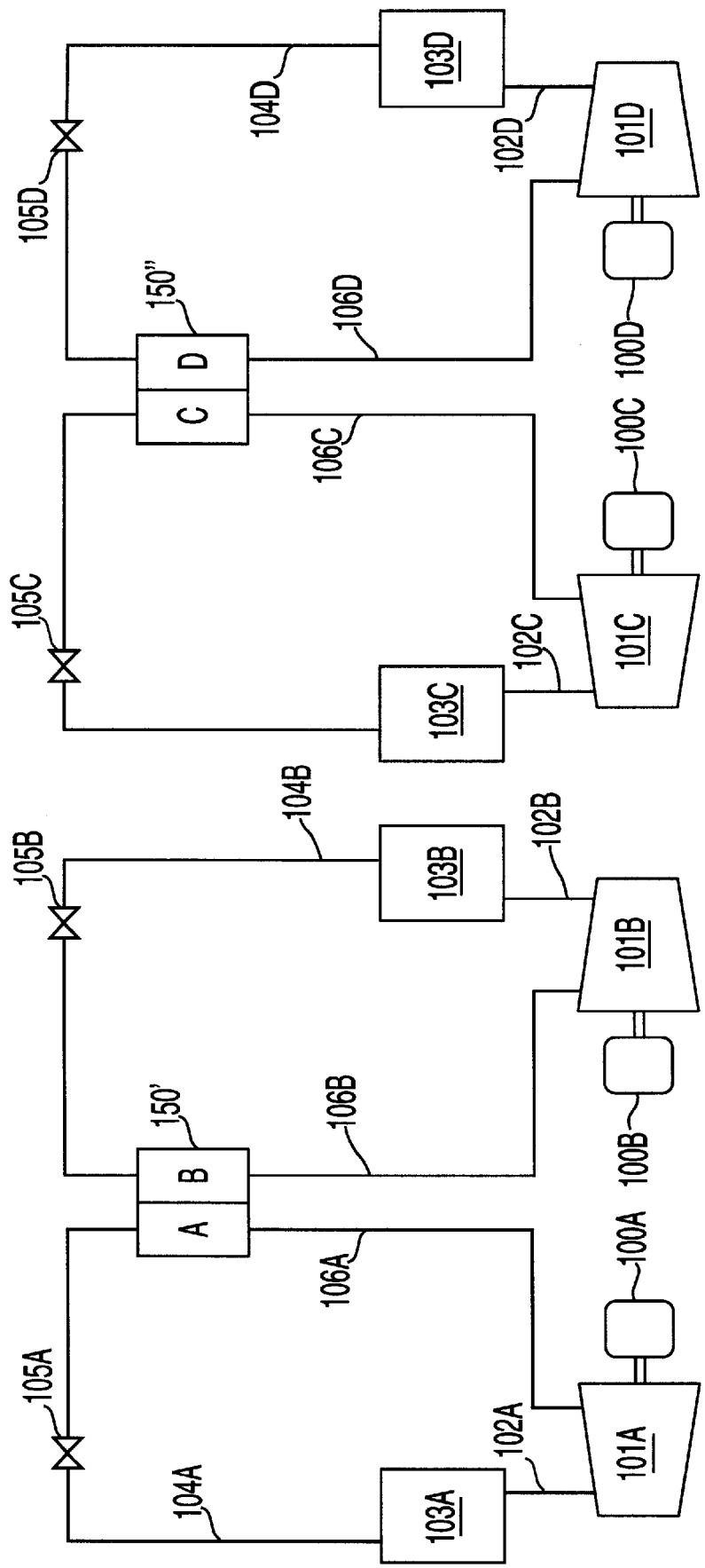
FIG. 5 is a view similar to FIG. 4 illustrating an alternative arrangement for the situation where multiple modules must be cooled.

FIG. 5 illustrates in simplified form another approach to the problem of cooling multiple modules 150' and 150". (For simplicity and ease of understanding, filter/dryers, accumulators and HGBVs are not shown since their placement and use is already clear from FIGS. 2 and 4.) In the embodiment shown in FIG. 5, the arrangement shown in FIG. 2 is essentially replicated for new cold plate 150". In the embodiment shown in FIG. 5, there are accordingly four separate cooling loops, namely, circuits A and B associated with compressors 101A and 101B, respectively. Likewise, coolant loops for sides C and D of evaporator 150" are associated with compressors 101C and 101D together with their appropriately and correspondingly labeled associated elements such as supply and coolant lines, expansion devices, condensers and motors. The multi-chip cooling solution illustrated in FIG. 5 is one possible alternative; however, it is not a preferred alternative in that it doubles the number of components (motors, compressors, condensers, accumulators, filter/dryers, HGBVs, etc.) that are required.

Figure 6:
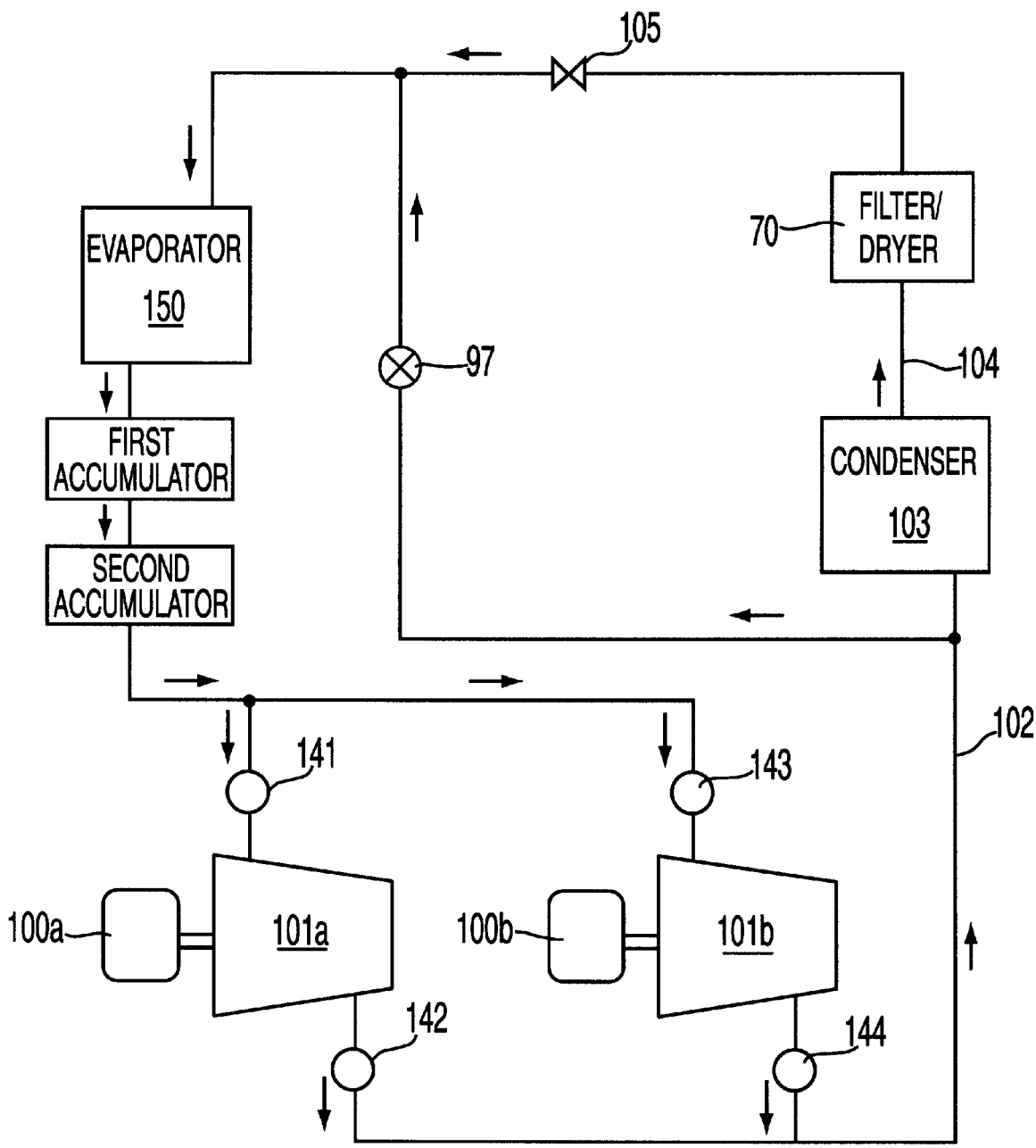
FIG. 6 is a functional block diagram illustrating an alternate redundancy arrangement for cold plate cooling.

Yet another embodiment which provides redundancy in a refrigeration cooling system for cold plate 150 is shown in FIG. 6. In this embodiment, redundancy is provided only insofar as the motors (100a and 100b) and the compressors (101a and 101b) are concerned. FIG. 6 has the advantage in that cold plate redesign is not required. In such an embodiment, cold plate 150 includes only a single coolant flow passage.

Nonetheless, the embodiment shown in FIG. 6 does provide a degree of redundancy by providing two motors and two compressors for compressing the refrigerant which is supplied to them via return line 106 from smaller accumulator 65 which is connected in the compressor return line to larger accumulator 60. The embodiment shown in FIG. 6 does not, however, provide redundancy protection, in the event that there is a problem (for example, a leak) in supply line 102, in condenser 103, in supply line 104, in expansion device 105, in cold plate 150 or in return line 106. Nonetheless, there is redundancy in that the electronic module cooled by cold plate 150 may still receive coolant from an operative one of the motor/compressor combinations. In such a circumstance, upon failure detection in one of the motor/compressor combinations, the other motor/compressor needs to be isolated from operating part of the system. Accordingly, for this purpose, shutoff valves 141 and 142 are actuated simultaneously to isolate compressor 101a. In a similar fashion, shutoff valves 143 and 144 serve to isolate compressor 101b. This embodiment also employs HGBV 97 which functions as described above.

Figure 7:
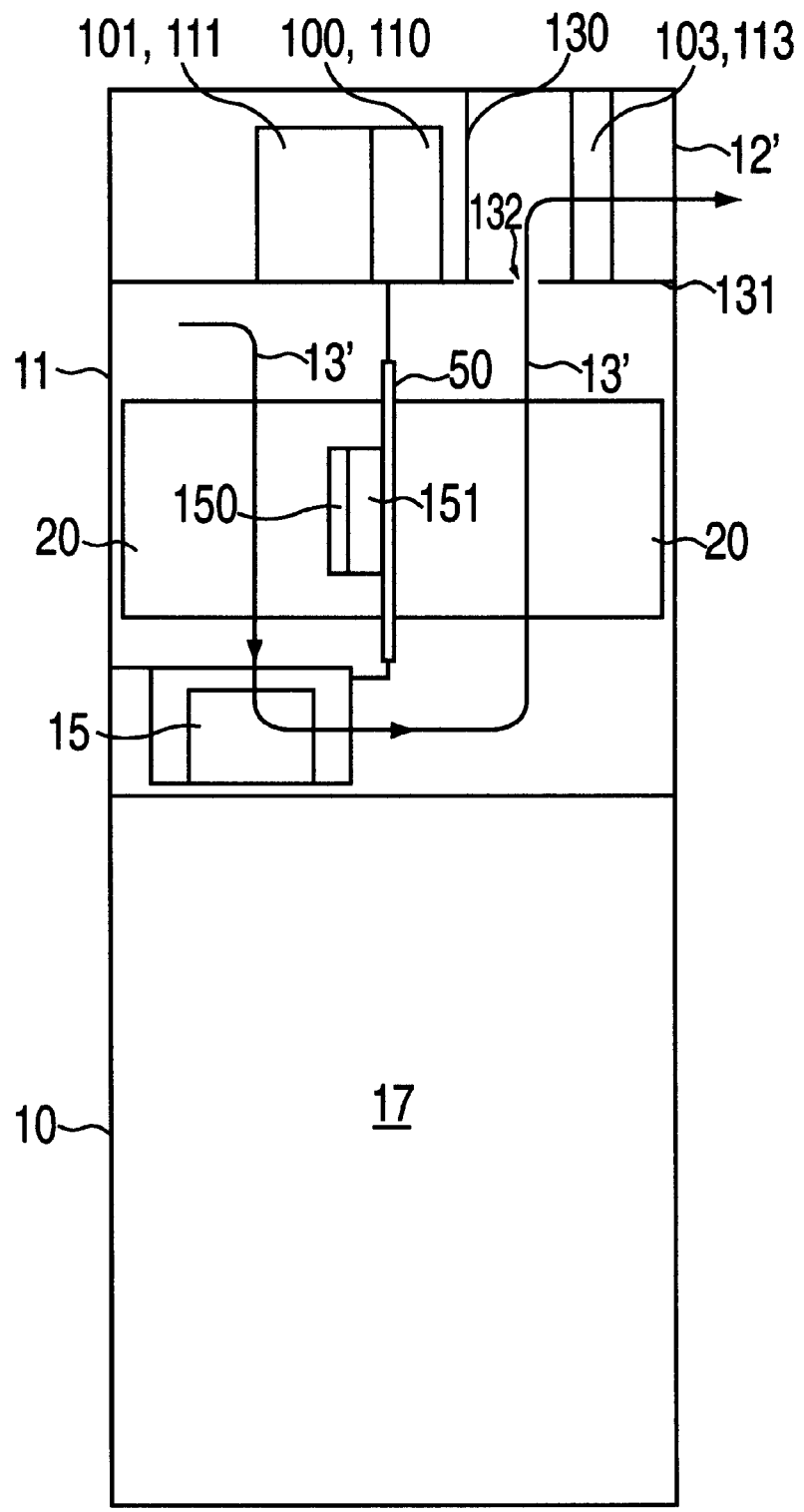
FIG. 7 is a side elevation view similar to FIG. 1A but more particularly illustrating an alternative air flow path.

Another embodiment of the present invention is illustrated in FIG. 7. FIG. 7 is similar to FIGS. 1A and 1B but it more particularly illustrates the fact that a different air circulation flow path 13' may be provided which also acts to remove heat from condensers 103 and/or 113. This mechanism is provided by opening 132 in shelf 131 (in cabinet 10) which supports the refrigeration components. Correspondingly, exhaust opening 12 is moved upward to position 12', as shown in FIG. 7. Since it is primarily desirable that the condensers be cooled as opposed to the motor-compressor combinations which may or may not require cooling, barrier 130 is provided to ensure that air flow path 13' is directed across condensers 103 and 113 through exhaust opening 12'.

Attention is next directed to the design of cold plate 150 (or 150' or 150'' as appropriate). The embodiments shown in FIGS. 8–14 are particularly directed to those situations in which redundancy is provided in a manner which includes two entirely separate and distinct cooling circuits (referred to above as circuits A and B). In all of the cold plate embodiments illustrated in FIG. 8–14, separate but thermally coupled flow passages are provided. In preferred embodiments of the present invention, cold plates illustrated in FIGS. 8–14 preferably comprise a material such as aluminum or copper. However, any highly thermally conductive material may be employed. However, it is desirable that the material be relatively easily machinable.

Figure 8:
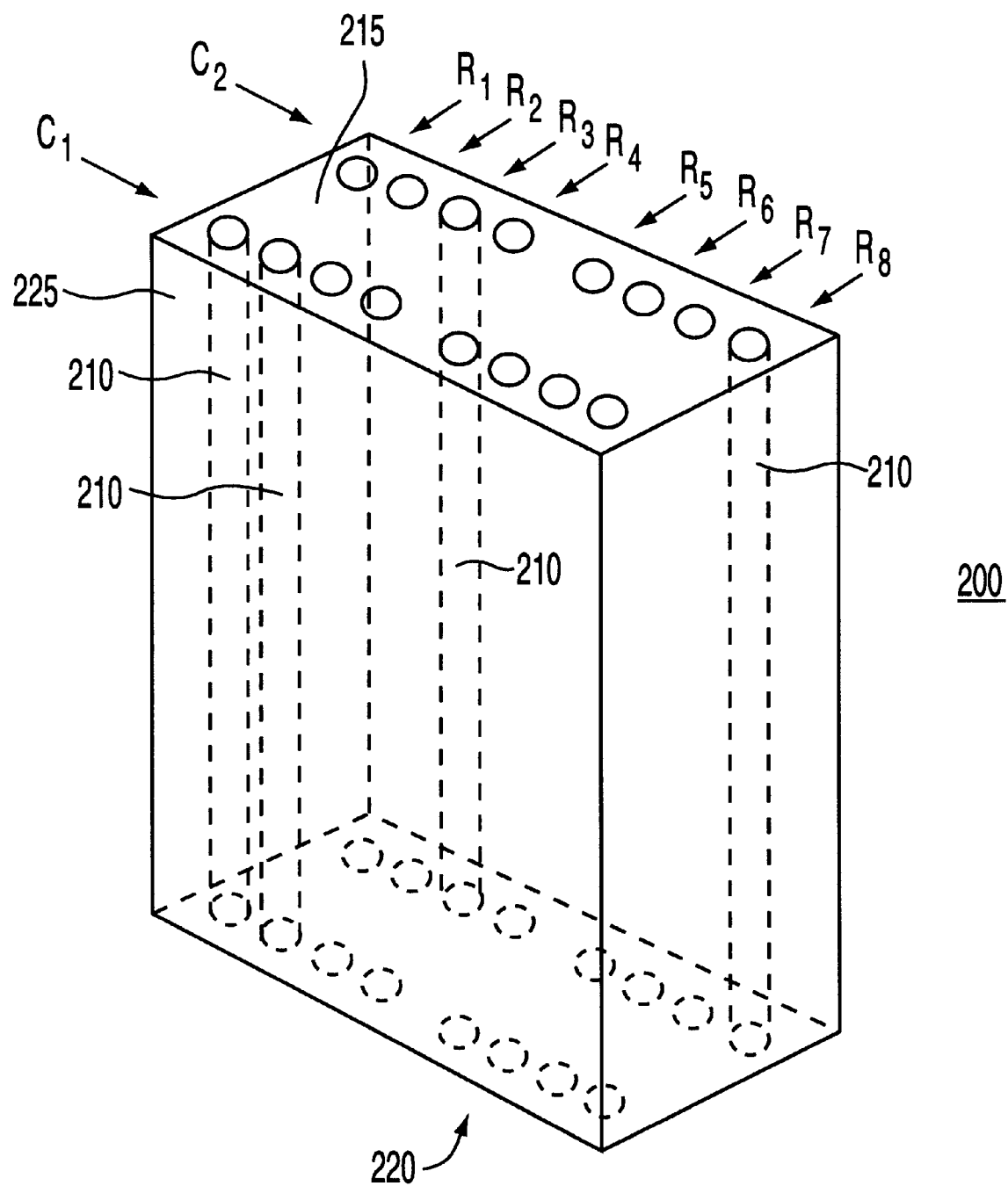
FIG. 8 is a perspective view illustrating the thermal block with through-hole passages.

Referring to FIG. 8, a thermal block 200 is first prepared from a highly thermal conductive material such as copper or aluminum. Passages 210 are bored and reamed or drilled into the block 200 in a predetermined pattern originating on a top surface 215 of the thermal block 200 and exiting on a bottom surface 220. In this embodiment two parallel columns of passages, $C_1$ and $C_2$, are constructed comprising rows $R_1$ through $R_8$. All of these passages 210 are essentially parallel to each other and parallel to the thermal interface 225 which will mate to the MCM (multi-chip module) heat source (not shown).

Figure 9A:
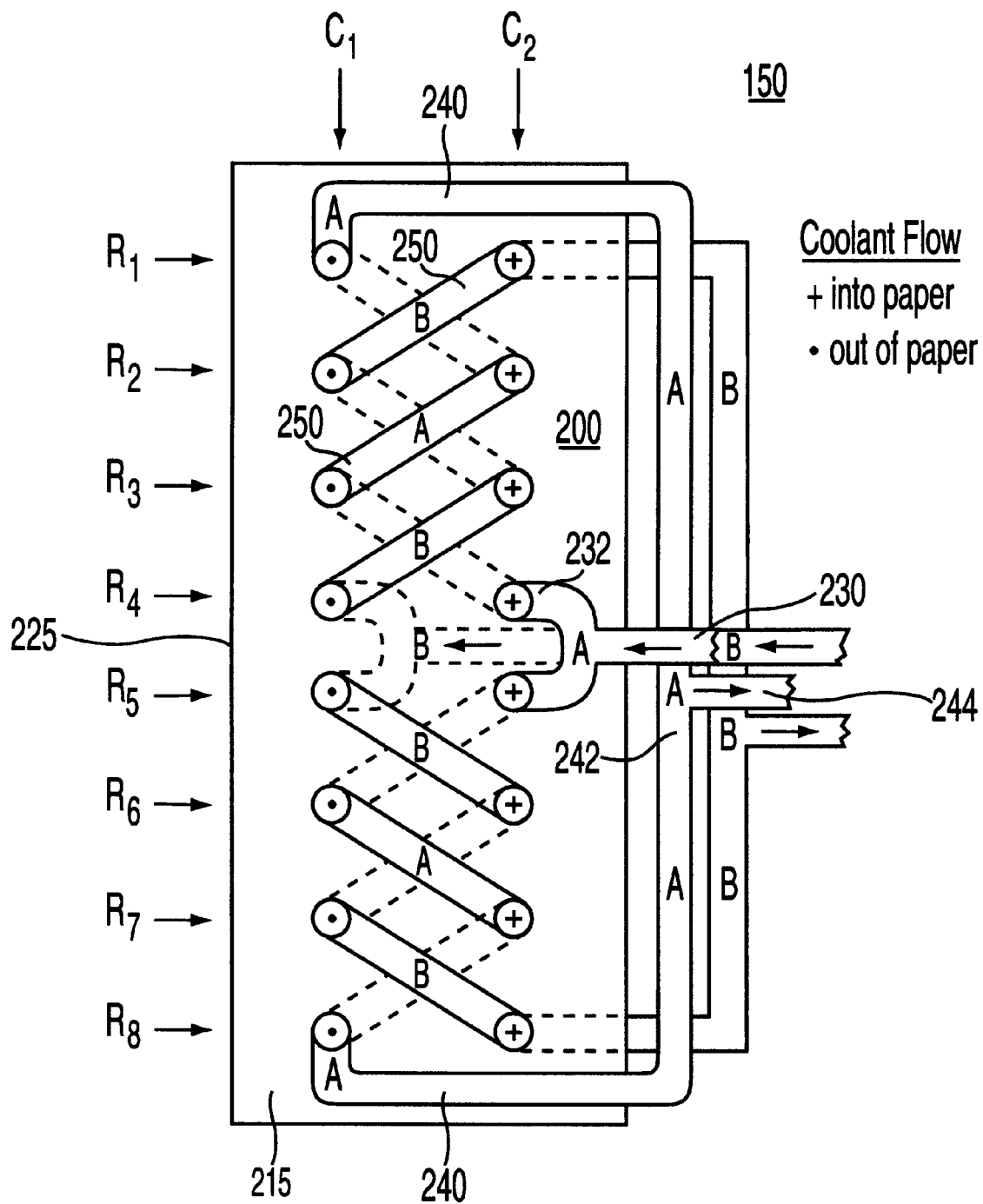
FIG. 9A is a top view of a first embodiment of the thermal block illustrating the route of flow of cooling circuits A and B.
Figure 9B:
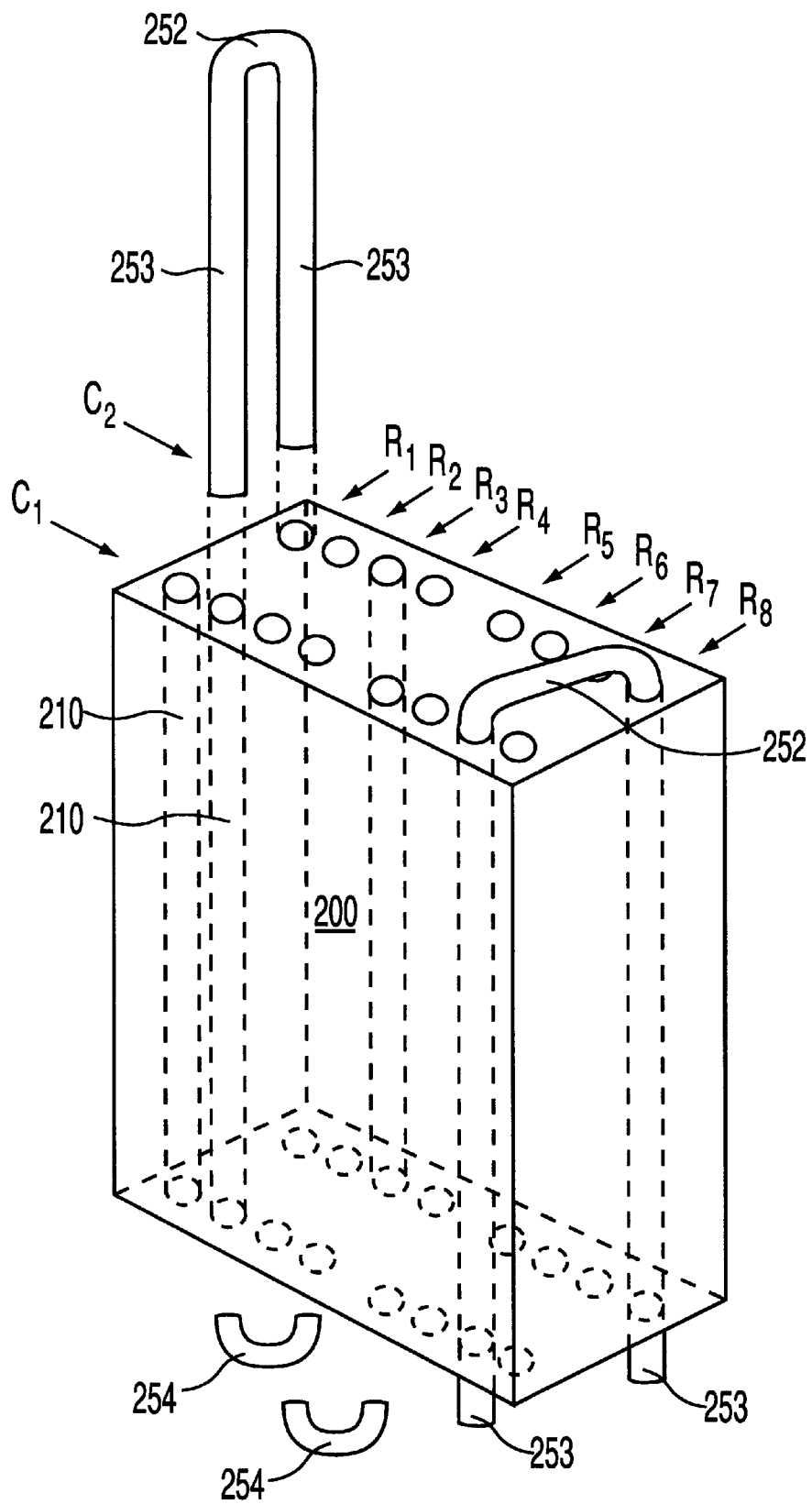
FIG. 9B is a perspective view of the thermal block illustrating a method of assembling refrigerant tubing to form cooling circuits A and B.
Figure 13:
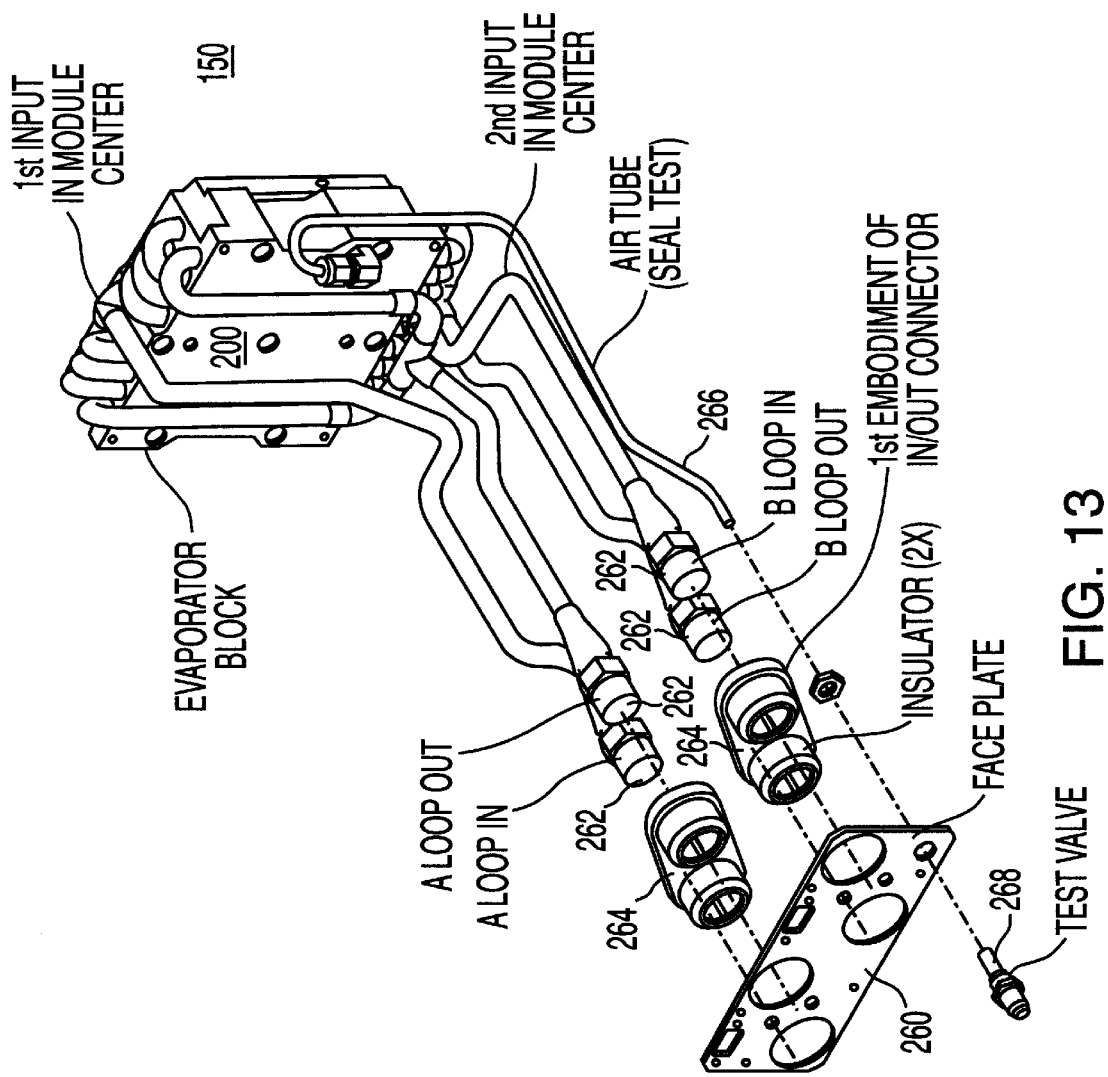
FIG. 13 is a perspective view illustrating a first embodiment with dual cooling loops.
Figure 14:
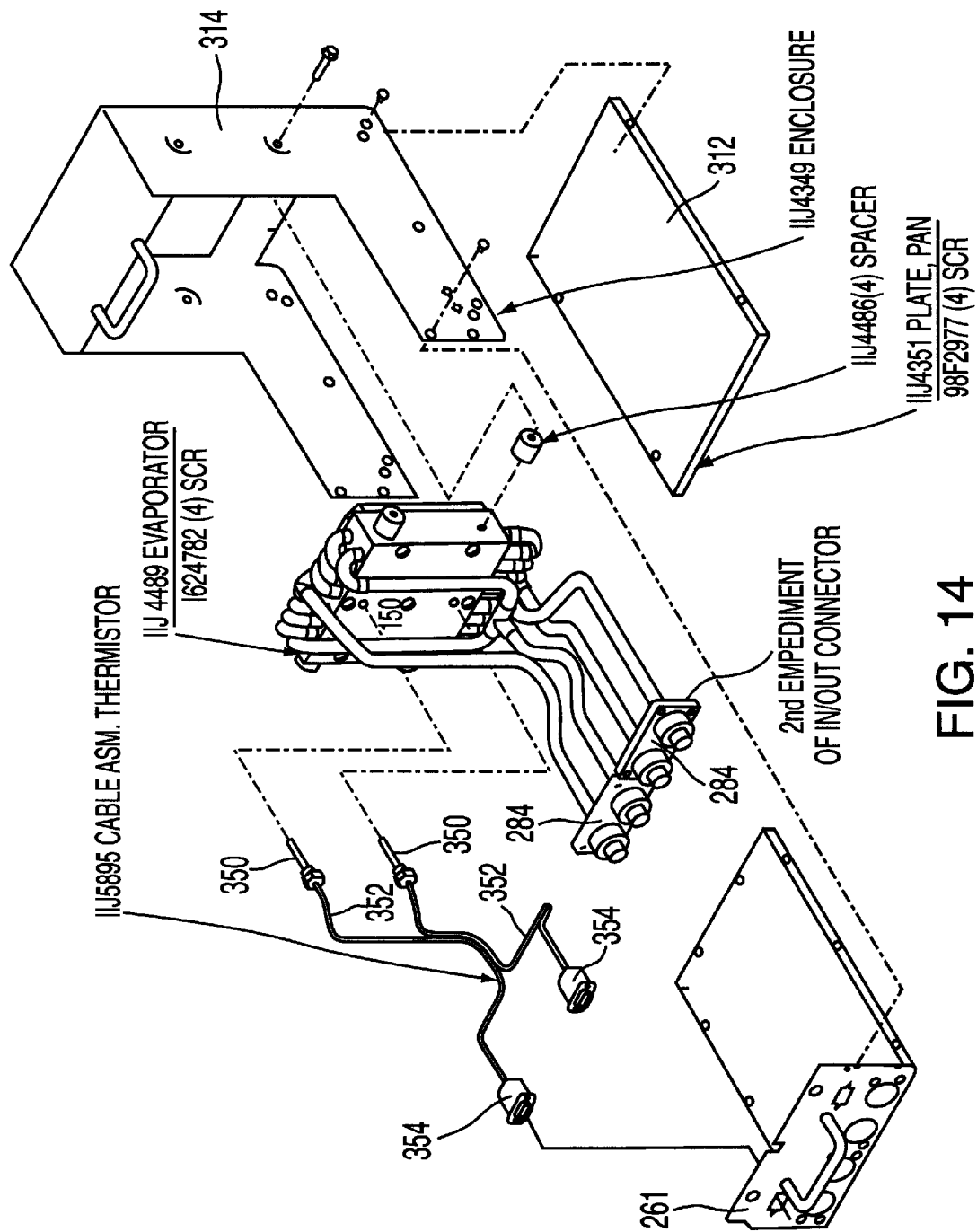
FIG. 14 is an exploded view illustrating a first embodiment of a cold plate and its rack mountable container.

Referring next to FIG. 9A where cooling circuits A & B are shown, and FIG. 9B where an assembly method of the cooling circuits is shown. Refrigerant tubing 250 with a matching O.D. to the passage 210 I.D. bore is cut and bent into first U-shaped sections 252 where each leg 253 is slightly longer than the depth of the passage 210 bore. These sections 252 are then pushed into the thermal block 200 so that each leg 253 of a U-shaped section 252 mates into a separate passage 210. In particular the U-shaped sections 252 pair up the passages 210 in the following manner. For cooling circuit A: $R_1C_1$ & $R_2C_2$; $R_3C_1$ & $R_4C_2$; $R_5C_2$ & $R_6C_1$; $R_7C_2$ & $R_8C_1$. A first input conduit 230 is connected to an input manifold 232 which supplies the U-shaped legs protruding from passages $R_4C_2$ & $R_5C_2$. Next, second shorter u-shaped sections 254 are formed to connect the protruding legs of the first u-shaped sections 252. For cooling circuit A, the second u-shaped sections 254 connect the following passages pairs on the top surface 215 of the thermal block 200: $R_3C_1$ & $R_2C_2$; and $R_6C_1$ & $R_7C_2$. To complete cooling circuit A, return lines 240 are provided from the refrigerant tubing legs 253 protruding from $C_1R_1$ & $C_1R_8$ back to an output manifold 242 which further connects to the output conduit 244 for cooling loop A. The input and output conduits 230 & 244 are terminated at the sealable connectors 262 on face plate 260 as shown in FIGS. 13 & 14.

In a similar manner cooling circuit B is constructed in the thermal block 200 with the following exceptions. The first and longer U-shaped sections 252 are inserted from the top surface 215 of the thermal block 200. The second and shorter u-shaped sections 254, input conduit 230, input manifold 232, output manifold 242, and output conduit 244 are all assembled on the bottom surface 220 of the thermal block 200. Thus two separate and independent cooling circuits, A & B, are constructed so that the coolant in each circuit is feed by their respective input conduits and manifolds to the center passages $R_4C_1$, $R_4C_2,R_5C_1$, & $R_5C_2$, of the cold plate 150 first, providing maximum cooling to the center of the thermal block 200. Each cooling circuit A & B, branches into parallel legs (parallel as in electric circuit terms, not geometry) cooling the plate 150 in serial fashion from the center to the edges. In this manner, cooling redundancy is maintained by similar cooling circuits. The geometry of the passage pattern (columns 1 & 2, rows 1–8) in the thermal block 200 may be altered to accommodate various design criteria. For example, the number of rows and columns may be varied, as may the drilling pattern. However, in any of the above envisioned modifications, the passages 210 are always connected with refrigerant tubing in such a manner so as to provide a flow pattern which delivers the coolant initially to the center of the thermal block and disperses the fluid in parallel circuits flowing towards each edge of the thermal block 200.

It should be noted that the above assembly sequence was descriptively organized to assist one in visualizing the construction of each cooling circuit A & B separately. In actual practice the first u-shaped sections 252 for both cooling circuits A & B are inserted at the same time in their respective passages 210. The first u-shaped sections 252 may, for both circuits A & B, be all inserted on the same surface of the thermal block 200, or they may be inserted from opposite surfaces for each circuit A and B. Next the thermal block 200 and first u-shaped sections 252 are metallurgically bonded so that the entire surface of the first u-shaped sections 252 enclosed in the passages 210 are bonded to the thermal block 200. This provides not only a stronger mechanical device, but more importantly, creates and maintains an excellent thermal conductance path for thermal energy across the entire enclosed first u-shaped section 252 surfaces, i.e., from the thermal block 200 to the refrigerant tubing 250.

For example, the first u-shaped tubing sections 252 assembled into the passages 210 can be attached by brazing; soldering or even by gluing. However, in the case of attachment via epoxy, it is desired that the thermal resistance created by the attachment, is within an acceptable range. As indicated above, it is one of the primary objectives of the cold plate design employed herein to preserve flow-wise isolation between the coolant flow in the two sets of passages. It should be particularly noted that the embodiments illustrated in FIGS. 8–14 are particularly advantageous in this regard. These embodiments completely eliminate the possibility of fluid leaking between the two circuits within the cold plate.

Figure 10:
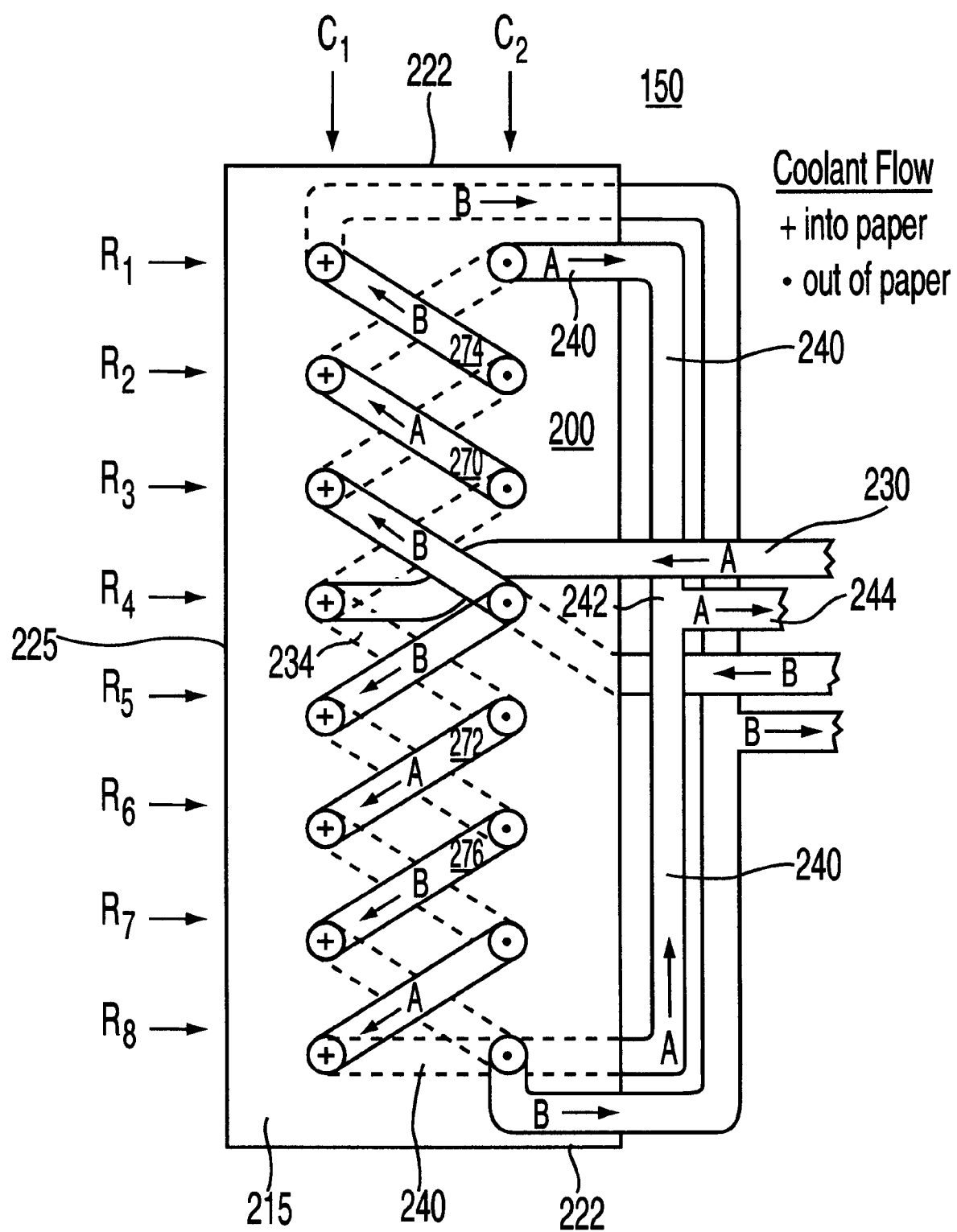
FIG. 10 is a top view of a second embodiment of the thermal block illustrating the route of flow of cooling circuits A and B.

Referring now to FIG. 10, a second embodiment of the present invention is shown. The cooling circuits A & B are constructed in the same manner as described in the foregoing embodiment with variations as necessary to implement the different flow pattern. In this embodiment the A input conduit 230 is connected to a tubing section leg 253 assembled into passage $R_4C_1$ at a top surface 215 of the thermal block 200. The opposite end of the tubing section exits the bottom surface 220 of the thermal block 200 and connects to two parallel A cooling branches 270 & 272 through a Y-manifold 234. Each cooling branch 270 & 272 is further linked to other passages 210 progressing towards respective side edges 222 of the thermal block 200. Cooling circuit A return lines 240 connect the terminal passages $R_1C_2$ & $R_8C_1$ to an A output manifold 242 supplying the coolant to the A output conduit 244. Cooling circuit B is similarly constructed. The second embodiment (FIG. 10) is similar to the first embodiment (FIG. 9A) in that the coolant is once again center fed to the thermal block 200. The difference being in that branching of each cooling circuit A & B in the first embodiment occurred prior to entering the thermal block 200, whereas in the second embodiment, branching occurred after the cooling circuits A & B had each first flowed through a center passage 210. The second embodiment provides a more uniform distribution of coolant across the thermal interface 225 as the pattern of coolant flow for the first column $C_1$ alternates one for one as to each cooling circuit A & B, i.e., $R_1C_1=B$, $R_2C_1=A$, $R_3C_1=B$, $R_4C_1=A$, $R_5C_1=B$, $R_6C_1=A$, $R_7C_1=B$, and $R_8C_1=A$. In the first embodiment (FIG. 9A), the B cooling circuit dominates the center of column 1 of the thermal block 200 as shown by the cooling pattern $R_1C_1=A$, $R_2C_1=B$, $R_3C_1=A$, $R_4C_1=B$, $R_5C_1=B$, $R_6C_1=A$, $R_7C_1=B$, and $R_8C_1=A$. The first embodiment is more easily adaptable to production manufacturing and such distinctions as to cooling circuit patterns between the two embodiments can be minimized by adjusting the passage pattern arrangement and dimensions.

In preferred embodiments of the present invention, it is clearly desirable that the cold plate be made as flat as possible to conform to the exterior packaging of electronic module 151. However, in those circumstances in which module 151 comprises a curved or even a stepped design, it is nonetheless possible to provide an appropriate cold plate by correspondingly machining or molding, the thermal interface 225 of the thermal block 200. However, in general, a good flat thermal mating surface is preferable.

Figure 11:
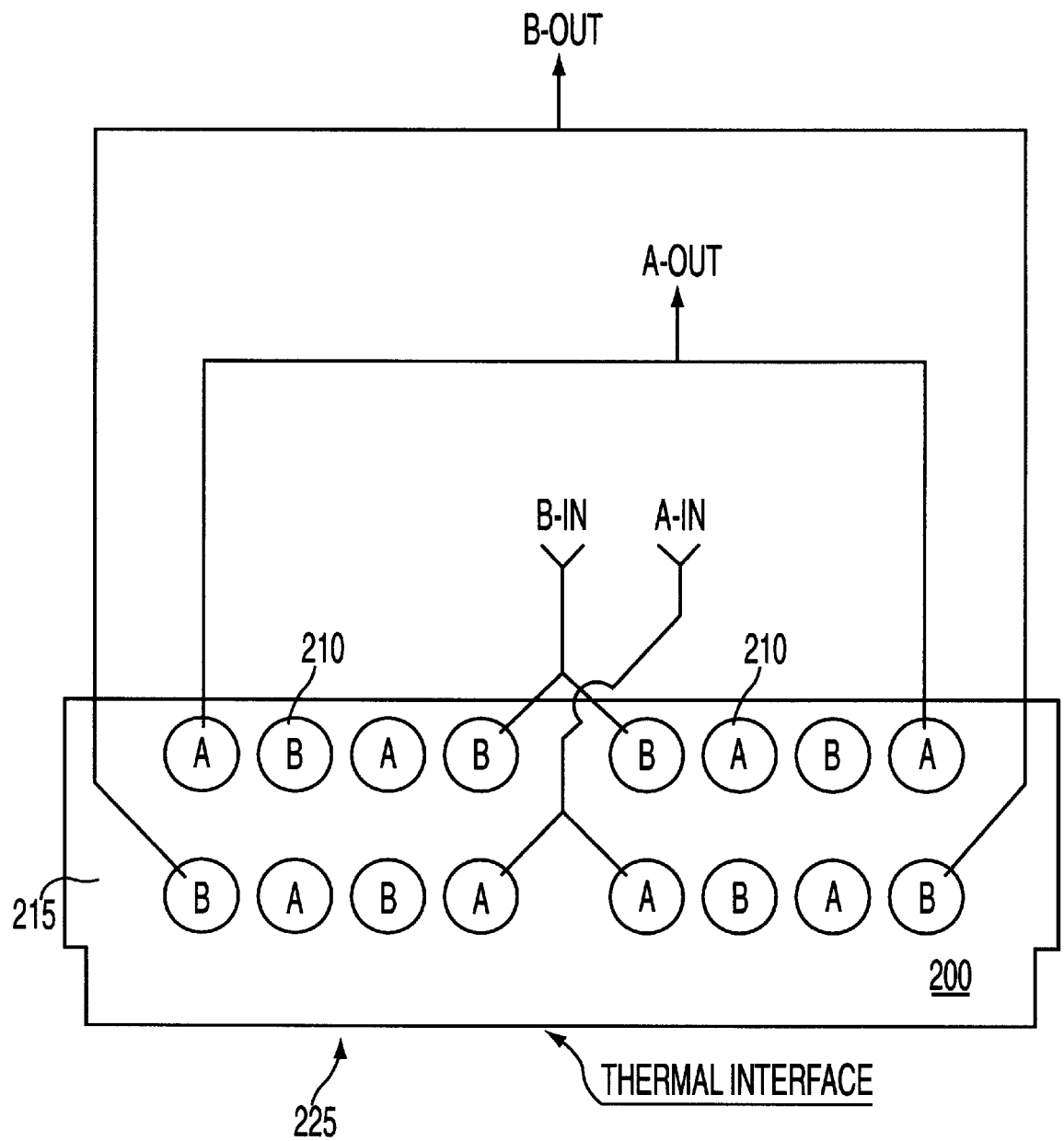
FIG. 11 is a schematic diagram of the route of flow of cooling circuits A and B as shown in FIG. 9A.

FIG. 11 is a schematic diagram of the first embodiment showing the thermal block 200, passages 210, thermal interface 225, cooling circuits A & B.

Figure 12:
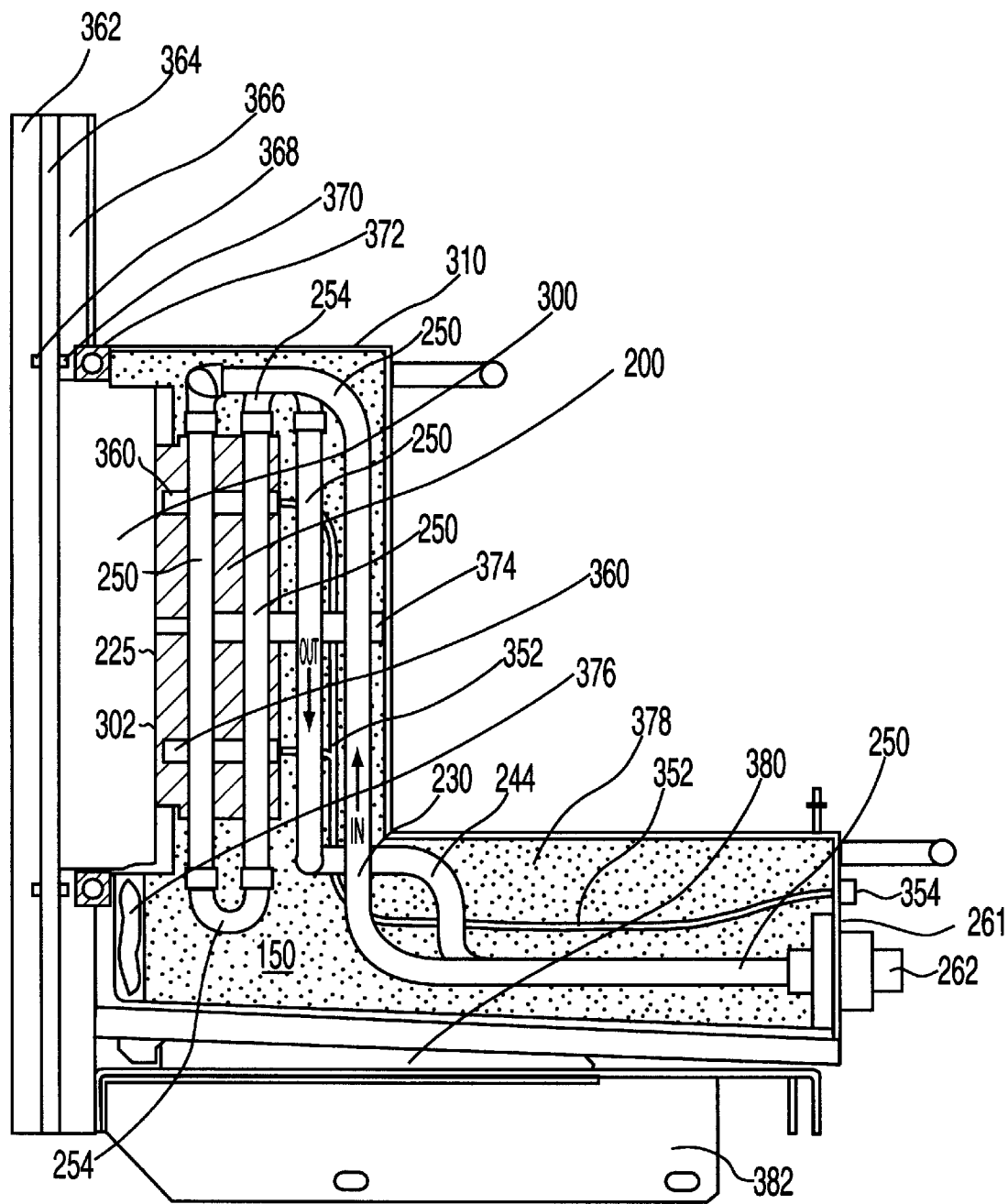
FIG. 12 is a cross-sectional view illustrating a cold plate in an installed configuration to cool a multi-chip module (MCM)

FIG. 12 is a cross-sectional view of a cold plate 150 installed in an operational configuration as the evaporator chassis 310 is slid into place guided into place by inclined ramps 380 mounted to a support bracket 382. The thermal interface 225 of the thermal block 200 is in thermal communication with the multi-chip module 300 (MCM). A-thin layer of oil 302 increases thermal communication between the two surfaces. As the MCM 300 generates thermal energy, it is conducted away through the cold plate 150 which is controlled by the cooling system controller 195 (FIG. 3).

The cold plate 150 is preferably well insulated from the surrounding air to prevent condensation. The evaporator chassis 310 is filled with a urethane foam 378 which insulates the cold plate 150 and the refrigerant tubing 250 from thermal losses due to air which is relatively warmer than the cold plate 150. A desiccant bag 376 located below the thermal interface 225 absorbs any condensation which runs off the thermal block 200 or the MCM 300.

The MCM 300 is mounted to a planer board 364 which is strengthened by rear stiffener 362 and front stiffener 366. The stiffeners 362 & 366 are circumferentially sealed onto the planar board 364 by respective rear and front o-rings 368 & 370. A gasket 372 circumferentially seals the front stiffener 366 and the evaporator chassis 310 to create an airtight seal at the perimeter mating surface.

Once the evaporator chassis 310 is in place against the MCM 300, screws (not shown) are inserted into mounting holes 374. The screw threads are received by matching threaded holes (not shown) in the MCM 300 and the cold plate 150 is further mated to the MCM 300 by tightening of the screws.

The two thermistor holes 360, one each located in the top and bottom portions of the thermal block 200 receive respective thermistors 350 whose respective cables 352 terminate at their respective connectors 354 mounted on the evaporator chassis faceplate 261.

In this particular embodiment shown, (FIG. 12) the coolant circuits are formed by first inserting straight sections of tubing 250 into thermal block 200. Each end of the straight tubing sections 250 is then connected by $2^{nd}$ u-shaped sections 254 to form the cooling loop A or B. However it was later determined that this method of fabricating the cooling branches was not as efficient as using $1^{st}$ u-shaped sections 252 as described above with respect to FIGS. 9A & 9B. Using the $1^{st}$ u-shaped sections to fabricate the cooling branches allows for a more compact design because there is no joint to fabricate at one end. Further, from a manufacturing perspective, it is also cheaper and quicker to use the $1^{st}$ u-shaped sections 252 when building the cold plate 150. However in completeness both approaches are disclosed herein to the construction of the present invention.

FIG. 13 shows a cold plate 150 with cooling circuits A & B. Sealable connectors 262 terminate each input and output conduit 230 & 244. Offset insulators 264 are provided to mount sealable connectors 262 in the face plate 260 in a diagonally offset configuration. The insulators 264 prevent cooling loss by thermal conduction through the face plate 260. An air tube 266 from the thermal block 200 terminates in a test valve 268 mounted on the face plate 260.

FIG. 14 shows a cold plate 150 and its modular container 310 in an exploded view. The container 310 consists of base plate 312, enclosure 314, and face plate 261 with a horizontal hole pattern for insulators 284. Thermistors 350 are inserted into the thermal block 200 where they sense heat and transmit a signal over cables 352 to connectors 354. Face plate 261 has a horizontal hole pattern to receive horizontal insulators 284 which secure the sealable connectors 262 for cooling circuits A & B.

Figure 15:
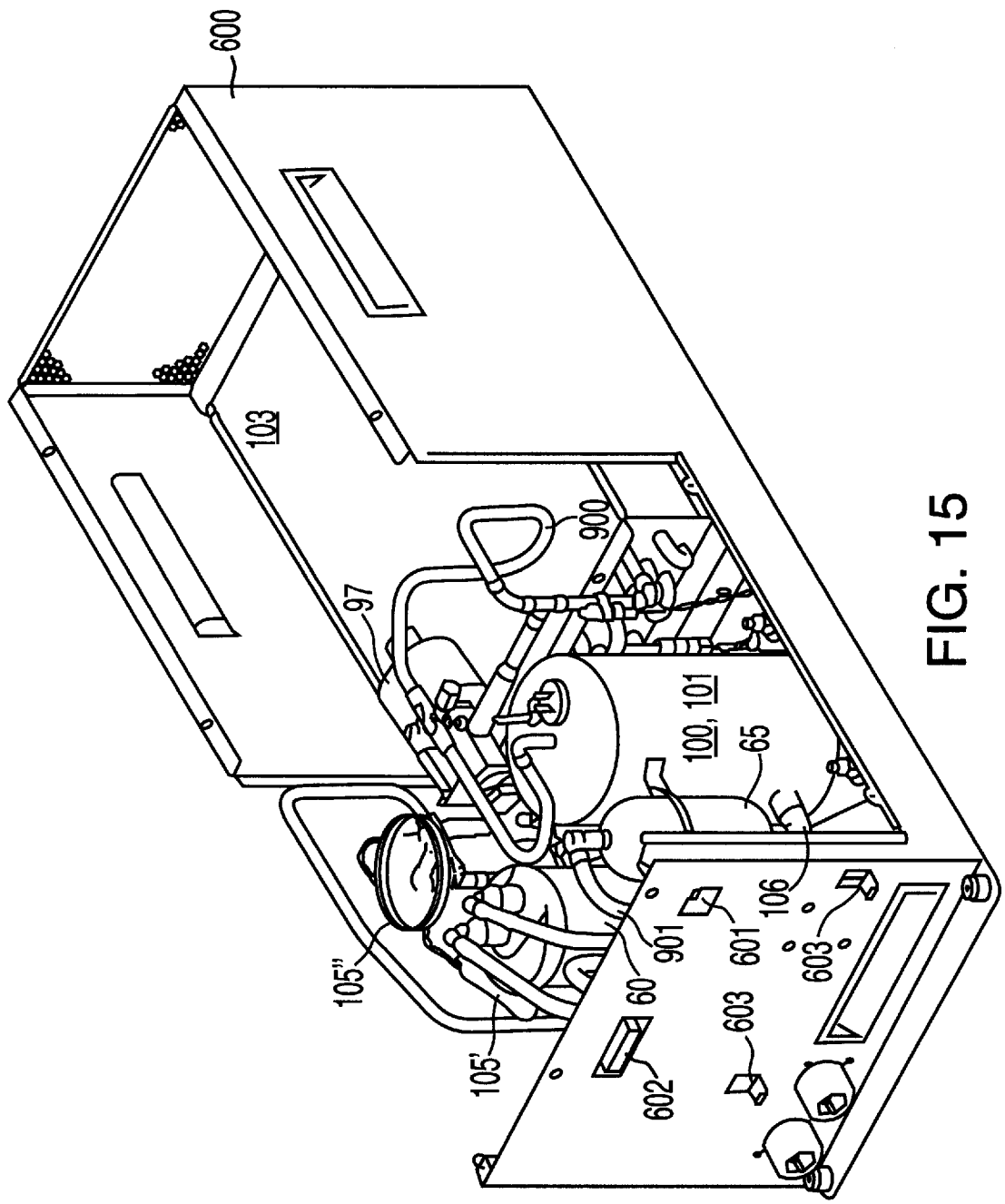
FIG. 15 is an isometric view illustrating the modular refrigeration unit (MRU) of the present invention with covers removed to provide an internal view of the configuration of its sub-components and also particularly illustrating anti-vibration tubing configuration.

FIG. 15 is an isometric view illustrating a preferred configuration for one side of the modular refrigeration system illustrated in FIG. 2. In particular, it is seen that cabinet or housing 600 contains condenser 103 which is of substantially standard design except that it preferably includes S-shaped aluminum fins which create an improved flow of cooling air through condenser 103. Furthermore, condenser 103 preferably includes tubing having rifled internal ridges to improve its efficiency. These are fine internal ridges which help to promote heat transfer. Likewise, FIG. 15 illustrates the presence of motor/compressor unit 100, 101, hot gas bypass valve 97 and two portions, bulb 105' and coiled loop 105", of the thermal expansion device. Large accumulator 60, together with smaller accumulator 65, are also shown. It is also important to note the presence of loops 900 and 901 in coolant conduits. These loops have been seen to be very desirable additions to the structure in that they help to eliminate vibration in the system. Vibration could otherwise be a problem particularly at low motor speeds.

It is also noted that cabinet or housing 600 includes four-pin socket 601 for supplying power to motor/compressor 100,101 and bracket 603 for supporting a printed circuit board containing control circuitry. Signals to and from this board may be supplied via multi-pin DIN socket 602. Connection to evaporator/cold plate 150 is provided through quick disconnect couplers 604 and 605.

Figure 16:
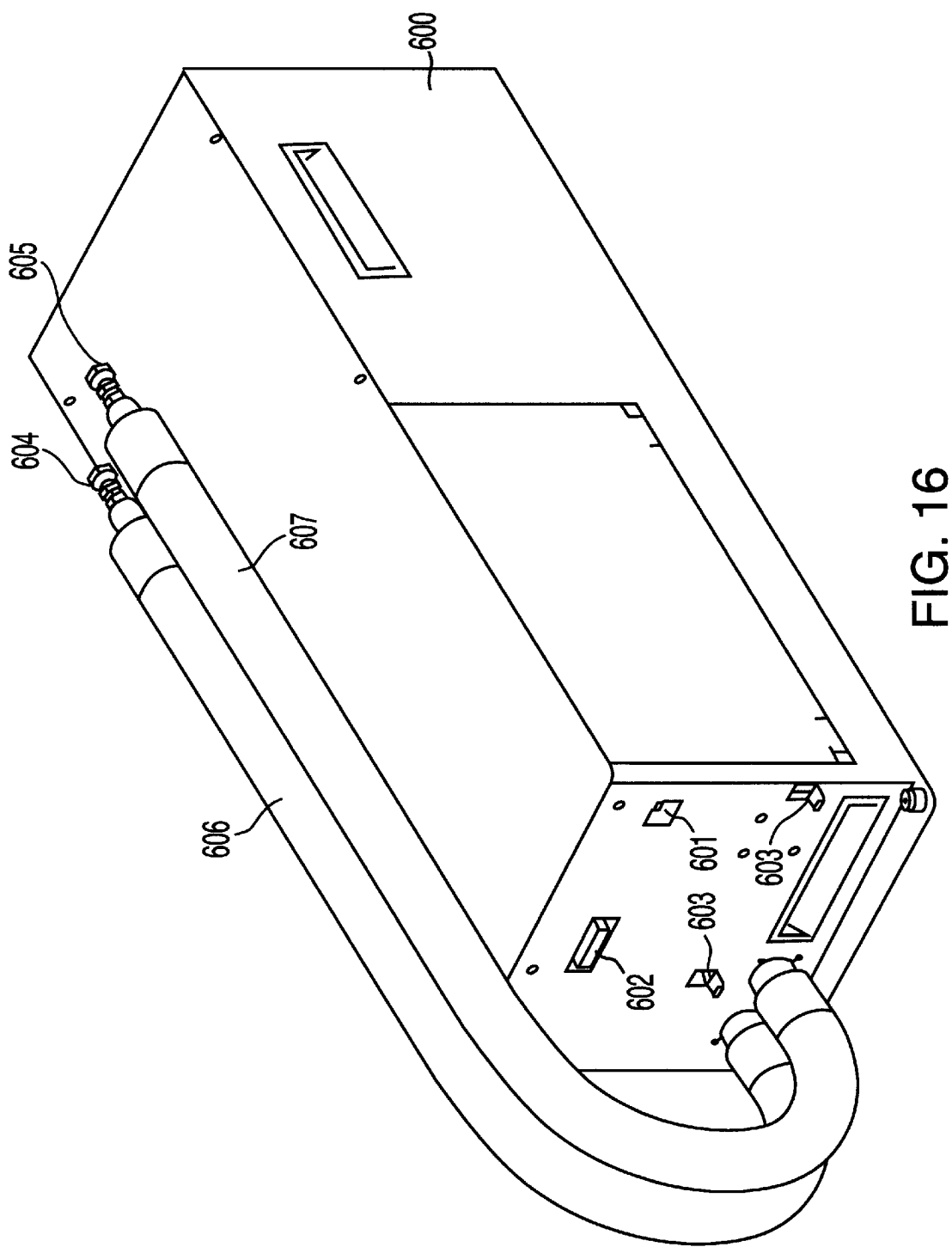
FIG. 16 is an isometric view similar to FIG. 15, but more particularly illustrating a closed MRU together with its quick disconnect connectors for attachment to a cold plate and/or evaporator.

FIG. 16 more particularly shows the closed cabinet together with quick disconnect conduits 606 and 607 which are attached to quick disconnect sockets 604 and 605, respectively, as a means for supplying cooled refrigerant to evaporator/cold plate 150.

Figure 17:
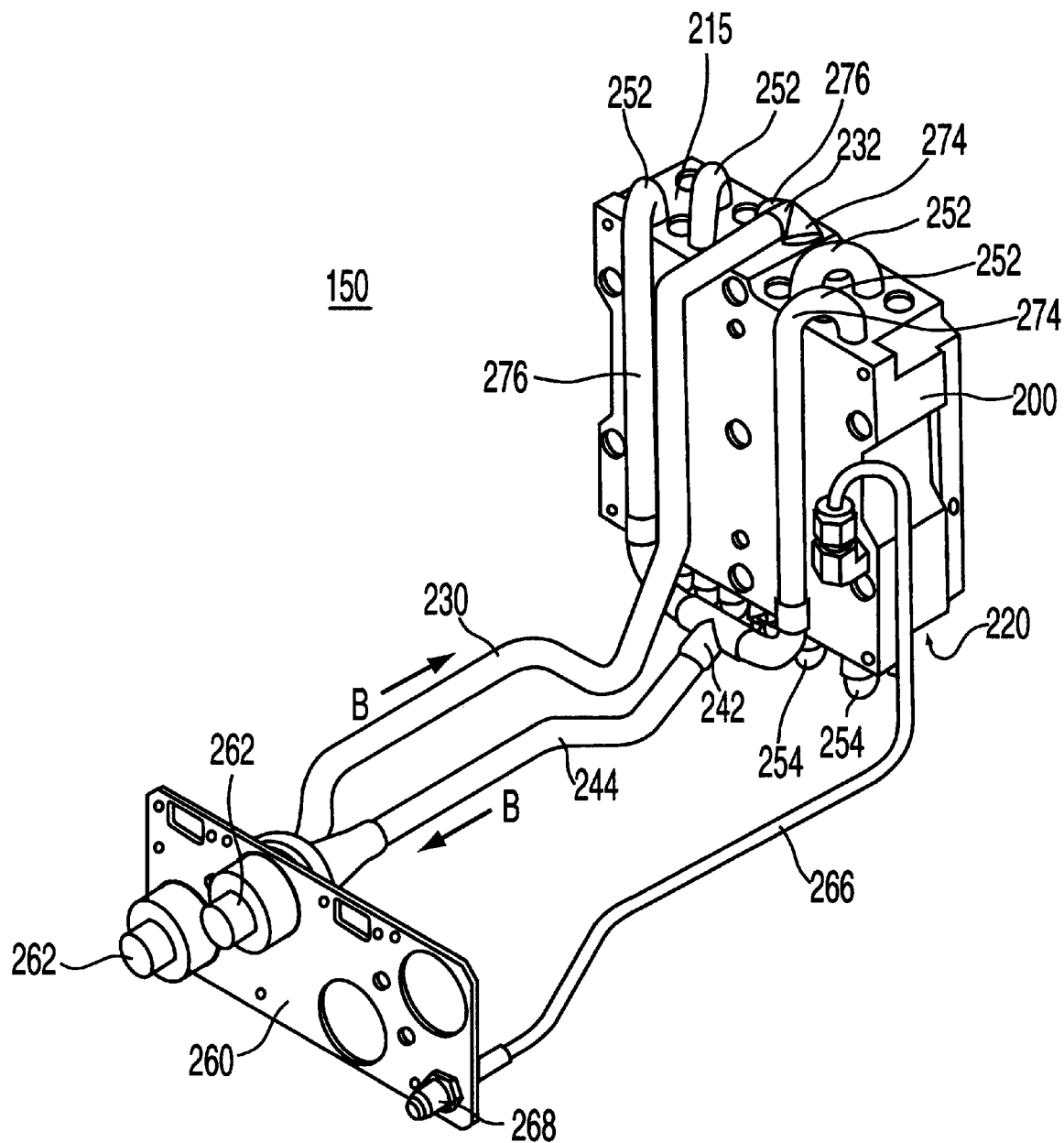
FIG. 17 is an isometric view illustrating a cold plate with only one cooling circuit installed in the thermal block so as to more clearly depict the center feed cooling circuit topology of the present invention.

Referring to FIG. 17, a cold plate 150 is shown with only a single cooling circuit B (with topology as shown in FIG. 9A) assembled into a thermal block 200. Cooling circuit B is constructed by an input conduit 230 originating at a sealable connector 262 mounted on faceplate 260 and connected to an input manifold 232 on the top surface 215 of the thermal block 200. Four first u-shaped sections have been inserted into the thermal block 200 from the top surface 215 with a specially formed first u-shaped section 232 integrating the input manifold 232 into the section body and inserted in the center most passages. Second u-shape sections 254 connect the first u-shape sections 252 at the bottom surface 220 of the thermal block 200 to form the dual cooling branches 274 & 276. The cooling circuit B is completed by joining the cooling branches 274 & 276 at the output manifold 242 and feeding into the output conduit 244 which terminates at a second sealable connector 262 at the face plate 260. From this FIG. 17, it is shown how coolant is initially directed to the center of the thermal block 200, where the flow is split into two parallel cooling branches 274 & 276 flowing towards opposite side edges of the thermal block 200, and finally returning to the cooling system (not shown) through an output conduit 244. In this manner, a very uniform thermal gradient is created across the thermal interface of the MCM 300.

Figure 18:
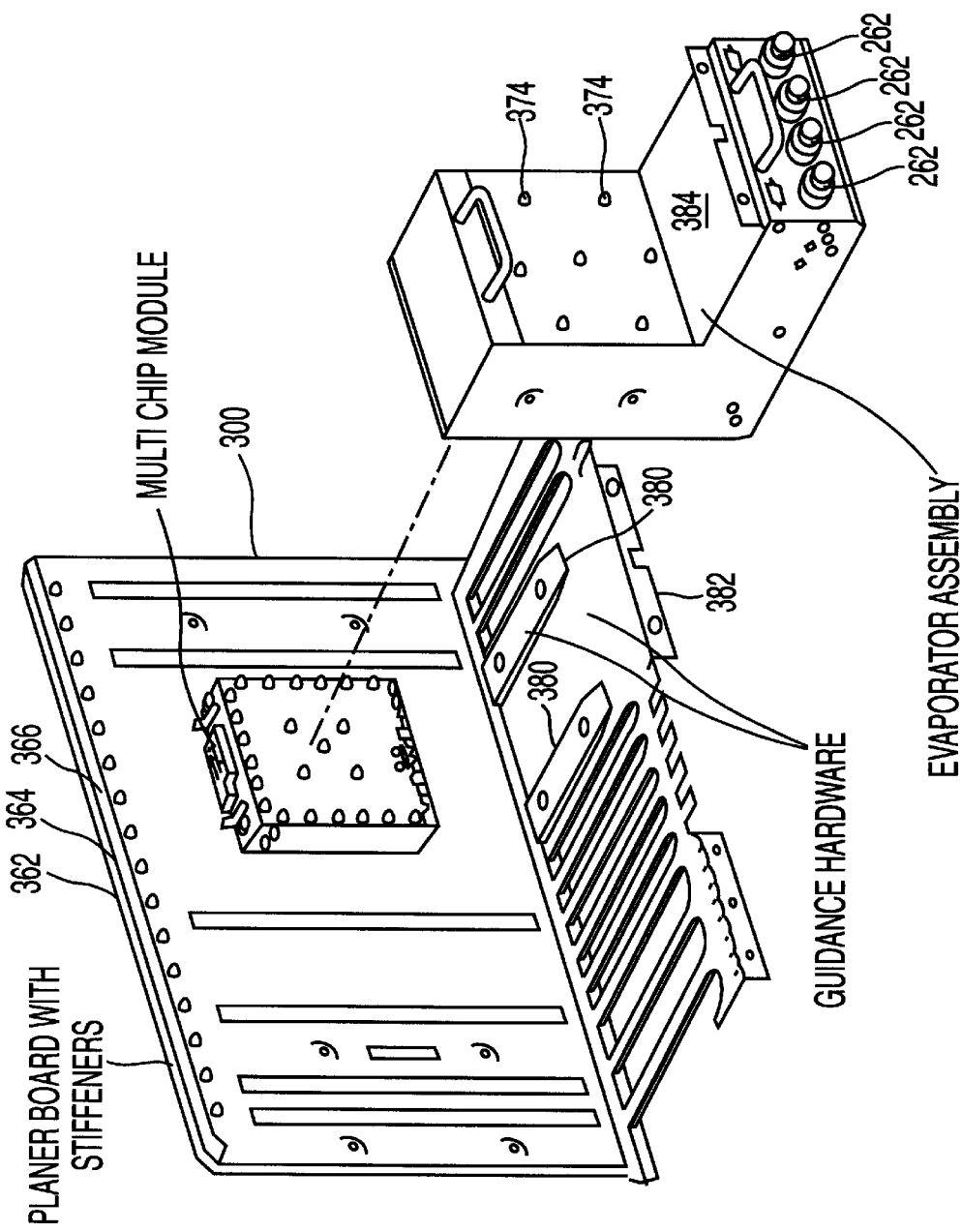
FIG. 18 is an isometric view illustrating an evaporator assembly and a multi-chip module mounted on a circuit board which depicts the manner in which the evaporator assembly will slide into position against the MCM for operational cooling.

Referring to FIG. 18, the evaporator assembly 384 is shown in alignment for mounting to the MCM 300. The assembly 384 will slide on inclined ramps 380 on a support bracket 382 until the thermal interface 225 (not shown) of the evaporator assembly 384 mates with the MCM 300. Mounting screws (not shown) are inserted into mounting holes 374 to mechanically compress the thermal block 200 onto the MCM 300.

The preferred refrigerant used in the above cooling systems is R134A which is a standard refrigerant known and used in environmental friendly cooling systems.

From the above, it should be appreciated that the systems and apparatus described herein provide a reliable redundant cooling system for computer and other electronic systems. It should also be appreciated that the cooling systems of the present invention permit the operation of computer systems at increased speeds. It should also be appreciated that the objects described above have been filled by the systems and methods shown herein particularly with respect to the utilization of a cold plate having dual flow-wise isolated but thermally coupled passages.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of fabricating a cold plate comprising:
   boring a plurality of passages in a thermal mass;
   forming a plurality of cooling branches wherein each branch is formed by mechanically linking a plurality of said passages in serial communication with each other and each said branch providing a fluid communication path between a central portion and a non-central portion of said thermal mass;
   forming a first cooling circuit by providing an first input conduit from a first cooling system to at least one of said cooling branches at said central portion of said thermal mass; and
   further forming said first cooling circuit by providing a first output conduit from said cooling branches at said non-central portion of said thermal mass to said first cooling system.

2. A method of fabricating a cold plate as in claim 1 further comprising:
   forming a second cooling circuit by providing a second input conduit to at least one of said cooling branches at said central portion of said thermal mass;
   further forming said second cooling circuit by providing a second output conduit from said cooling branches at said non-central portion of said thermal mass to said second cooling system;
   wherein said first and second cooling circuits, each respective said cooling branches and respective said cooling systems are in fluid isolation with respect to each other.

3. A method of fabricating a cold plate as in claim 2 further comprise for each said cooling branch providing a branch conduit originating at a non-occupied passage first opening of one of a centrally located said passage, with said branch conduit passing through and exiting said passage at a second non-occupied opening, and said branch conduit entering, passing through and exiting other adjacent unoccupied passages in a serial serpentine manner defining a fluid path progressing from said central thermal mass portion to said non-central thermal mass portion.

4. A method of fabricating a cold plate as in claim 3 further comprising:
   forming a metallurgical bond between each portion of an exterior surface of said branch conduit enclosed by each portion of an interior passage surface; and
   forming a plurality of interior axial fins on an interior surface of each said cooling conduit;
   wherein said providing said branch conduit further comprises providing said branch conduit having continuous physical and thermal communication along said interior wall of each said passage traversed by said branch conduit.

5. A method of fabricating a cold plate as in claim 4 further comprising:
   providing at least one temperature sensor in thermal communication with said thermal mass transmitting a cold plate thermal signal in response to said thermal energy absorbed; and
   providing a cooling system controller receiving and responsive to said cold plate thermal signal;
   wherein said controller controls said cooling systems so as to maintain a predetermined temperature range in said cold plate thermal mass.

6. A method of fabricating a cold plate as in claim 5 further comprising:
   terminating each said input and output conduit of each said cooling circuit at a sealable fluid connector provided and mounted on a face plate;
   said sealable connectors operatively provided to mate with said cooling systems; and
   pre-charging said cooling circuits with a refrigerant and sealing said fluid connectors;
   wherein the cooling circuits remain in a sealed condition protected from contaminants until use.

7. A method of fabricating a cold plate as in claim 6 further comprising the following steps:
- providing a rack mountable box into which said cold plate is fixed;
- providing a sliding mechanism adjacent to a said thermal source for operatively sliding said box into a final location wherein said thermal interface mates with said thermal source; and
- configuring said face plate so as to remain exposed after said box is slid into a final location to facilitate connections with said cooling systems.

8. A method of fabricating a cold plate as in claim 3 wherein said providing said cooling branch comprises:
- forming a plurality of first u-shaped conduit sections having first and second legs;
- assembling said first u-shaped conduit sections into said thermal mass so that each leg of the first u-shaped conduit is mated into a first opening of one of an adjacent said passages, said legs protruding from a second opening of said passages;
- metallurgically bonding said thermal mass and each of said conduit legs along their mutual surfaces;
- forming a plurality of second u-shaped conduit sections having first and second legs;
- providing a first input conduit from a first cooling system to at least one of said first u-shaped conduit legs located in a central portion of said thermal mass;
- providing a first output conduit from at least one of said first u-shaped conduit legs located in a central portion of said thermal mass to a first cooling system;
- assembling each second u-shaped section leg onto a first u-shaped section leg so that each second u-shaped section connects two differing but adjacent first u-shaped sections;
- wherein a cooling branch is provided which originates at a central thermal mass location and terminates at a non-central thermal mass location.

9. A method of fabricating a cold plate as in claim 1 further comprising:
- providing a second input conduit from a second cooling system to at least one of another said first u-shaped conduit legs located in said central portion of said thermal mass;
- providing a second output conduit from at least one of another said first u-shaped conduit legs located in said non-central portion of said thermal mass to a second cooling system;
- wherein a second cooling branch is provided which originates at a central thermal mass location and terminates at a non-central thermal mass location; said first and second cooling branches being in fluid isolation from each other.

* * * * *

UNITED STATES PATENT AND TRADEMARK OFFICE
CERTIFICATE OF CORRECTION

PATENT NO. : 6,167,621 B1
DATED : January 2, 2001
INVENTOR(S) : Goth et al.

It is certified that error appears in the above-identified patent and that said Letters Patent is hereby corrected as shown below:

Drawings,
Figure 3, after "COOLANT B" delete "TEMPERAURE" and insert therefor
-- TEMPERATURE --
Figure 3, before "COOLING SYSTEM CONTROLLER" delete "MICRFOPROCESSOR" and therefor -- MICROPROCESSOR --
Figure 4, delete "62" and insert therefor -- 60 --
Figure 18, before "BOARD" delete "PLANER" and insert therefor -- PLANAR --

Column 5,
Line 20, "flowed" delete "passed" and insert therefor -- past --

Column 6,
Line 56, after "motor" delete "101" and insert therefor -- 100 --

Column 9,
Line 22, after "in" delete "FIG." and insert therefor -- FIGS. --

Column 10,
Line 8, before "by" delete "feed" and insert therefor -- fed --

Column 11,
Line 41, after "place" delete "guide into place" and insert therefor -- (guided into place) --
Line 57, after "a" delete "planer" and insert therefor -- planar --

Column 12,
Line 33, after "container" and insert therefor -- , chassis --

Column 13,
Line 14, after "section" delete "232" and insert therefor -- 252 --

Column 14,
Line 23, after "further" delete "comprise" and insert therefor -- comprises --

UNITED STATES PATENT AND TRADEMARK OFFICE
CERTIFICATE OF CORRECTION

PATENT NO. : 6,167,621 B1
DATED : January 2, 2001
INVENTOR(S) : Goth et al.

It is certified that error appears in the above-identified patent and that said Letters Patent is hereby corrected as shown below:

Column 15,
Line 5, after "to" delete "a"
Line 6, before "for" delete "source" and insert therefor -- mass --
Line 13, after "wherein" delete "said"

Signed and Sealed this

Third Day of May, 2005

JON W. DUDAS
*Director of the United States Patent and Trademark Office*